United States Patent
Laquai

(10) Patent No.: US 9,954,546 B2
(45) Date of Patent: Apr. 24, 2018

(54) REMOVAL OF SAMPLING CLOCK JITTER INDUCED IN AN OUTPUT SIGNAL OF AN ANALOG-TO-DIGITAL CONVERTER

(71) Applicant: Advantest Corporation, Tokyo (JP)

(72) Inventor: Bernd Laquai, Stuttgart (DE)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/603,713

(22) Filed: May 24, 2017

(65) Prior Publication Data
US 2017/0257107 A1 Sep. 7, 2017

Related U.S. Application Data

(63) Continuation of application No. PCT/EP2014/076031, filed on Nov. 28, 2014.

(51) Int. Cl.
*H03M 1/08* (2006.01)
*H03M 1/10* (2006.01)

(52) U.S. Cl.
CPC ....... *H03M 1/0836* (2013.01); *H03M 1/1071* (2013.01)

(58) Field of Classification Search
CPC .............. H03M 1/1071; H03M 1/0836; G01R 31/31709; G01R 31/31937; G01R 31/31725
(Continued)

(56) References Cited

U.S. PATENT DOCUMENTS 6,327,545 B1 12/2001 Browen et al.
6,397,160 B1 5/2002 Craig et al.
(Continued)

FOREIGN PATENT DOCUMENTS

EP 0626588 11/1994
EP 0984291 3/2000
(Continued)

OTHER PUBLICATIONS

Quintanel , S., et al., "On-Wafer Multi-Port Circuits Characterization Technique with a Two-Port VNA," IEEE 81st ARFTG Microwave Measurement Conference, Seattle, WA, Jun. 7, 2013, pp. 1-4.
(Continued)

*Primary Examiner* — Khai M Nguyen

(57) ABSTRACT

An automated test equipment for analyzing an analog time domain output signal of an electronic device under test includes: an analog-to-digital converter configured for converting an analog time domain signal; a sampling clock configured for producing a clock signal; a time-to-frequency converter configured for converting the digital time domain signal into a digital frequency domain signal so that the digital frequency domain signal is represented by frequency bins; a memory device configured for storing a set of empirically determined operating parameters; and a jitter components removal module for removing jitter components produced by the analog-to-digital converter, wherein the jitter removal module is configured for subtracting the lower spur and the upper spur of each frequency bin of the frequency bins from the digital frequency domain signal so that the cleaned digital frequency domain signal is produced.

30 Claims, 17 Drawing Sheets

(58) Field of Classification Search
USPC .................................................. 341/118, 120
See application file for complete search history.

(56) References Cited

U.S. PATENT DOCUMENTS

| | | | |
|---|---|---|---|
| 6,795,496 | B1 | 9/2004 | Soma et al. |
| 7,256,585 | B1 | 8/2007 | Shoulders |
| 7,856,330 | B2 * | 12/2010 | Hou ................. G01R 31/31937 324/532 |
| 8,310,385 | B2 * | 11/2012 | Dasnurkar .......... H03M 1/1095 341/120 |
| 2004/0004466 | A1 | 1/2004 | Miyanaga et al. |
| 2005/0050546 | A1 | 3/2005 | Remany et al. |
| 2005/0068068 | A1 | 3/2005 | Hall |
| 2005/0234662 | A1 | 10/2005 | Niedzwiecki et al. |
| 2009/0092177 | A1 | 4/2009 | Dvorak et al. |
| 2009/0129129 | A1 | 5/2009 | Udagawa |
| 2009/0272634 | A1 | 11/2009 | Ehlers et al. |
| 2010/0225301 | A1 | 9/2010 | Nakayama et al. |
| 2010/0228515 | A1 | 9/2010 | Srinivasan et al. |
| 2010/0309952 | A1 | 12/2010 | Asami |
| 2010/0312506 | A1 | 12/2010 | Taylor |
| 2011/0227767 | A1 | 9/2011 | O'Brien |
| 2012/0049655 | A1 | 3/2012 | Leyendecker et al. |
| 2012/0221279 | A1 | 8/2012 | Zhang |
| 2013/0006567 | A1 | 1/2013 | Horn |
| 2013/0229068 | A1 | 9/2013 | Sanders, III et al. |
| 2013/0234723 | A1 | 9/2013 | Behrens et al. |

FOREIGN PATENT DOCUMENTS

| | | |
|---|---|---|
| EP | 1298778 | 4/2003 |
| JP | H11038087 | 2/1999 |
| JP | 2000009792 | 1/2000 |
| WO | 99/21025 | 4/1999 |
| WO | 2012/084028 | 6/2012 |
| WO | 2014/135194 | 9/2014 |

OTHER PUBLICATIONS

Lenk, F., et al., "A New Multiport Measurement-Method Using a Two-Port Network Analyzer," IEEE MTT-S International Microwave Symposium, Jun. 12-17, 2005, pp. 1663-1666.

Kam, D.G., et al., "Multipart Measurement Method Using a Two-Part Network Analyzer With Remaining Ports Unterminated," IEEE Microwave and Wireless Components Letters, vol. 17, No. 9, Sep. 2007, pp. 694-696.

Chen, C.-J., et al., "An Error Analysis of the Scattering Matrix Renormalization Transform," IEEE Transactions on Microwave Theory and Techniques, vol. 57, No. 4, Apr. 2009, pp. 863-868.

Rolfes, I., et al., "Multiport Method for the Measurement of the Scattering Parameters of N-Ports," IEEE Transactions on Microwave Theory and Techniques, vol. 53, No. 6, Jun. 2005, pp. 1990-1996.

Sismanoglou, P., et al, "Input Test Data Compression Based on the Reuse of Parts of Dictionary Entries: Static and Dynamic Approaches," IEEE Transactions on Computer-Aided Design of Integrated Circuits and Systems, vol. 32, No. 11, Nov. 2013, pp. 1762-1775.

White, H.E., "Printed English Compression by Dictionary Encoding," Proceedings of the IEEE, vol. 55, No. 3, Mar. 1967, pp. 390-396.

Nieuwoudt, I et al., "Algorithms for a Shared Resource Scheduling Problem in Which Some Level of Conflict is Tolerable," Journal of Scheduling, Kluwer Academic Publishers, vol. 15, No. 6, Sep. 29, 2012, pp. 681-702.

Jamal, Shafiq M. et al., "Calibration of Sample-Time Error in a Two-Channel Time-Interleaved Analog-to-Digital Converter," IEEE Transactions on Circuits and Systems, I: Regular Papers, vol. 51, No. 1, Jan. 1, 2004, pp. 130-139.

Marple, S. Lawrence Jr., "Computing the Discrete-Time 'Analytic' Signal via FFT," IEEE Transactions on Signal Processing, vol. 47, No. 9, Sep. 1, 1999, pp. 2600-2603.

Liu, Lei, "Finite Automata for Evaluating Testbed Resource Contention," IEEE, Wireless Telecommunications Symposium WTS 2007, Piscataway, NJ, Apr. 26, 2007, pp. 1-6.

Ting, Shang-Kee et al., "An Algorithm to Compensate the Effects of Spurious PLL Tones in Spectrum Sensing Architectures", IEEE Transactions on Circuits and Systems, I: Regular Papers, vol. 59, No. 5, May 1, 2012, pp. 1093-1106.

* cited by examiner

REMOVAL OF SAMPLING CLOCK JITTER INDUCED IN AN OUTPUT SIGNAL OF AN ANALOG-TO-DIGITAL CONVERTER

CROSS-REFERENCE TO RELATED APPLICATIONS

This application is a continuation of copending International Application No. PCT/EP2014/076031, filed Nov. 28, 2014, which is incorporated herein by reference in its entirety.

Analog-to-digital converters (A/D converters) in automated test equipment (ATE) are useful for digitizing analog signals from a device under test.

BACKGROUND OF THE INVENTION

The performance of a high bandwidth analog-to-digital converter is often limited by the performance of the high frequency sampling clock that may be used. Such a high frequency sampling clock is typically generated from PLLs that suffer from jitter or phase noise impurities. The sampling clock jitter impurities may be induced into an output signal of the analog-to-digital converter and, therefore, deteriorate the performance of high end measurement instrumentation of an automated test equipment (ATE).

SUMMARY

According to an embodiment, an automated test equipment for analyzing an analog time domain output signal of an electronic device under test may have: an analog-to-digital converter configured for converting an analog time domain signal, which is during a normal mode of operation the analog time domain output signal of the electronic device under test, into a digital time domain signal by obtaining a sample of the analog time domain signal at each sampling point of a plurality of sampling points; a sampling clock configured for producing a clock signal, which is fed to the analog-to-digital converter for specifying each sampling point of the plurality of sampling points over time; a time-to-frequency converter configured for converting the digital time domain signal into a digital frequency domain signal so that the digital frequency domain signal is represented by frequency bins; a memory device configured for storing a set of empirically determined operating parameters; and a jitter components removal module for removing jitter components produced by the analog-to-digital converter in order to produce a cleaned digital frequency domain signal, wherein the jitter component removal module is configured for determining, based on the set of empirically determined operating parameters, for each frequency bin of the frequency bins an amplitude and a frequency of at least one lower spur having a lower frequency than the respective frequency bin to which it is related to and an amplitude and a frequency of at least one upper spur having a higher frequency than the respective frequency bin to which it is related to, wherein the jitter removal module is configured for subtracting the lower spur and the upper spur of each frequency bin of the frequency bins from the digital frequency domain signal so that the cleaned digital frequency domain signal is produced.

Another embodiment may have a calibration device for empirically determining a set of operating parameters for an automated test equipment, in particular for an automated test equipment for analyzing an analog time domain output signal of an electronic device under test, which automated test equipment may have: an analog-to-digital converter configured for converting an analog time domain signal, which is during a normal mode of operation the analog time domain output signal of the electronic device under test, into a digital time domain signal by acquiring a sample of the analog time domain signal at each sampling point of a plurality of sampling points; a sampling clock configured for producing a clock signal, which is fed to the analog-to-digital converter for specifying each sampling point of the plurality of sampling points over time; a time-to-frequency converter configured for converting the digital time domain signal into a digital frequency domain signal so that the digital frequency domain signal is represented by frequency bins; a memory device configured for storing a set of empirically determined operating parameters; and a jitter components removal module for removing jitter components produced by the analog-to-digital converter in order to produce a cleaned digital frequency domain signal, wherein the jitter component removal module is configured for determining, based on the set of empirically determined operating parameters, for each frequency bin of the frequency bins an amplitude and a frequency of at least one lower spur having a lower frequency than the respective frequency bin to which it is related to and an amplitude and a frequency of at least one upper spur having a higher frequency than the respective frequency bin to which it is related to, wherein the jitter removal module is configured for subtracting the lower spur and the upper spur of each frequency bin of the frequency bins from the digital frequency domain signal so that the cleaned digital frequency domain signal is produced, which calibration device may have: a signal processor configured for calculating a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal; and a parameter processor configured for determining the set of operating parameters based on the jitter modulation function.

According to another embodiment, a system may have an inventive automated test equipment and an inventive calibration device.

According to another embodiment, a method for operating an automated test equipment for analyzing an analog time domain output signal of an electronic device under test may have the steps of: converting an analog time domain signal, which is during a normal mode of operation the analog time domain output signal of the electronic device under test, into a digital time domain signal using an analog-to-digital converter obtaining a sample of the analog time domain signal at each sampling point of a plurality of sampling points; producing a clock signal using a sampling clock, which is fed to the analog-to-digital converter for specifying each sampling point of the plurality of sampling points over time; converting the digital time domain signal into a digital frequency domain signal using a time-to-frequency converter so that the digital frequency domain signal is represented by frequency bins; storing a set of empirically determined operating parameters a memory device; and removing jitter components produced by the analog-to-digital converter in order to produce a cleaned digital frequency domain signal using a jitter components removal module, wherein, based on the set of empirically determined operating parameters, for each frequency bin of the frequency bins an amplitude and a frequency of at least one lower spur having a lower frequency than the respective frequency bin to which it is related to and an amplitude and a frequency of at least one upper spur having a higher frequency than the respective frequency bin to which it is related to are determined, and wherein the lower spur and the upper spur of each frequency bin of the frequency bins are subtracted from the digital frequency domain signal so that the cleaned digital frequency domain signal is produced.

According to another embodiment, a method for empirically determining a set of operating parameters for an automated test equipment may have the steps of: generating a reference tone signal including at least one sinusoidal signal component at a given frequency using a reference tone signal generator; establishing a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal, using a signal processor; and determining the set of operating parameters based on the jitter modulation function using a parameter processor.

According to another embodiment, a non-transitory digital storage medium may have computer-readable code stored thereon to perform, when running on a computer or a processor, any of the inventive methods.

The automated test equipment comprises:
  an analog-to-digital converter configured for converting an analog time domain signal, which is during a normal mode of operation the analog time domain output signal of the electronic device under test, into a digital time domain signal by obtaining a sample of the analog time domain signal at each sampling point of a plurality of sampling points;
  a sampling clock configured for producing a clock signal, which is fed to the analog-to-digital converter for specifying each sampling point of the plurality of sampling points over time;
  a time-to-frequency converter configured for converting the digital time domain signal into a digital frequency domain signal so that the digital frequency domain signal is represented by frequency bins;
  a memory device configured for storing a set of empirically determined operating parameters; and
  a jitter components removal module for removing jitter components produced by the analog-to-digital converter in order to produce a cleaned digital frequency domain signal, wherein the jitter component removal module is configured for determining, based on the set of empirically determined operating parameters, for each frequency bin of the frequency bins an amplitude and a frequency of at least one lower spur having a lower frequency than the respective frequency bin to which it is related to and an amplitude and a frequency of at least one upper spur having a higher frequency than the respective frequency bin to which it is related to, wherein the jitter removal module is configured for subtracting the lower spur and the upper spur of each frequency bin of the frequency bins from the digital frequency domain signal so that the cleaned digital frequency domain signal is produced.

When a jitter modulation of a sampling clock occurs, the sampling points during conversion get modulated in their phase with respect to the ideally regular sampling grid. Thus, the analog-to-digital converter no longer samples the waveform of the analog time domain signal, which is the input signal of the analog-to-digital converter, but a different waveform that can be described mathematically by modulating the original analog time domain signal in its phase.

In order to simplify the description, the original and a time domain signal is assumed to be a cosine function with frequency $f_0 = 1/T_0$ and amplitude 1:

$$s(t) = \cos(2\pi f_0 t)$$

When samples are taken in presence of a sinusoidal jitter described with a jitter modulation function $s_j(t)$ with a frequency of $f_j$ and a peak-to-peak jitter amplitude of $T_{jpp}$:

$$s_j(t) = \frac{T_{jpp}}{2} \cos(2\pi f_j t)$$

the ideally sampled waveform, sampled across one coherency Period $M^*T_0$ with N samples gets disturbed according to a phase modulation:

$$s_s(nT_s) = \sum_{n=0}^{N-1} s\left(nT_s + \pi \frac{T_{jpp}}{T_0} \cos(2\pi f_j nT_s)\right)$$

$$= \sum_{n=0}^{N-1} \cos\left(2\pi f_0 nT_s + \pi \frac{T_{jpp}}{T_0} \cos(2\pi f_j nT_s)\right)$$

with $T_s = M^*T_0/N$ applied this yields:

$$s_s(nT_s) = \sum_{n=0}^{N-1} \cos\left(2\pi n \frac{M}{N} + \pi \frac{T_{jpp}}{T_0} \cos\left(2\pi \frac{f_j}{f_0} n \frac{M}{N}\right)\right)$$

In order to judge the impact on the spectrum of such a non-ideally sampled waveform, a trigonometric identity may be applied:

$$\cos\left(x + \eta \cos(y)\right) = \sum_{n=-\infty}^{\infty} (-1)^n J_n(\eta) \cos(x \pm ny)$$

with:

$$J_{-n}(\eta) = (-1)^n \cdot J_n(\eta)$$

In the given sampled signal the so called modulation index $\eta = n\pi^* T_{jpp}/T_0$ may be considered to be small i.e. $\eta \ll 1$, therefore the modulation is called a small band modulation and the Bessel functions of first kind and n-th order $J_n(\eta)$ can be approximated:

$$J_n(\eta) = \frac{1}{n!}\left(\frac{\eta}{2}\right)^2$$

Due to the factorial in the denominator the values of $J_n$ decrease rapidly and therefore only the first few need to be taken into account. In most cases the assumption:

$$J_n(\eta) = 0 \text{ for } n > 1$$

is sufficient to describe the modulation impact adequately. Therefore it is possible to just look at the simple approximation of the sampled signal:

$$s_s(nT_s) = \sum_{n=0}^{N-1} \cos\left(2\pi n \frac{M}{N}\right) + \frac{\pi T_{jpp}}{2T_0} \cos\left(2\pi n \frac{M}{N}\left(1 \pm \frac{f_j}{f_0}\right)\right)$$

This result just means that two spurs appear in a single sided spectrum to the left and right at of the expected carrier at $f_0 \pm f_j/f_0$ with a relative height to the carrier of:

$$s_{spur}[dBc] = 20 * \log\left(\frac{\pi}{2}\frac{T_{jpp}}{T_0}\right)$$

If s(t) is not only a simple sine wave but an arbitrary signal that gets repeated with the coherency period it is possible to express this signal in terms of its Fourier series which is a linear combination of cosine terms added up to a Fourier sum:

$$s(t) = \sum_{k=1}^{N} \frac{a_0}{2} + a_k \cos\left(2\pi k \frac{M}{N} + \varphi_k\right)$$

Therefore, since s(t) is just a linear superposition of cosine functions and all jitter related relationships apply to each of the cosine terms in the Fourier series, the resulting phase modulated conversion signal is therefore composed as follows:

$$s_s(nT_s) = \sum_{n=0}^{N-1}\left(\sum_{k=1}^{N} \frac{a_0}{2} + a_k \cos\left(2\pi k \frac{M}{N} + \varphi_k \frac{\pi T_{jpp}}{2T_0} \cos\left(2\pi n \frac{M}{N}\left(1 \pm \frac{f_j}{f_0}\right)\right)\right)\right)$$

In other words, the two jitter spurs are generated for each spectral component of the original analog time domain signal (each cosine term) and superimpose on top of each other in a linear fashion. On the other hand, when the jitter modulation function is a generic periodic signal and is represented with more than one spectral component, another superposition occurs for all jitter modulation components in the same way. All these superpositions follow a linear cumulative scheme and thus can be taken into account term by term and are finally summed up to grand total.

Whereas random jitter often is still tolerable since its disturbing energy gets spread over the whole spectral domain, the deterministic jitter is most critical since all its disturbing energy gets concentrated into discrete frequency components. These discrete frequency components appear as significant spurs and may reduce the spurious free dynamic range of the conversion dramatically in particular for high frequency conversion signals.

According to the invention such deterministic jitter is removed from the output signal of the analog-to digital converter, which is the digital time domain signal, by converting the digital time domain signal into a digit to frequency domain signal so that the digital frequency domain signal is represented by frequency bins. As stated above it is possible in frequency domain to remove jitter components for each frequency bin independently as the jitter components of the different frequency bins are superimposed.

As stated above the jitter components of each frequency bin of the frequency bins may be seen as a Fourier series. However, most impact on the measurement have these jitter components, which are closest to the respective frequency bin. Therefore, measurements may be improved by removing of just one lower spur and by removing of just one upper spur for each of the bins.

For that purpose the frequency and amplitude of the lower spur and the upper spur may be calculated based on an empirically determined set of operating parameters, which may be stored in the memory. How such a set of operating parameters may be found will be discussed later in here.

The computational effort for the jitter removal is limited, since jitter cleansing procedure may be performed on the analog frequency domain signal, which corresponds to the analog time domain output signal of the electronic device under test by means of a FFT which in most cases is useful anyway when an analog time domain output signal analysis is requested. The effort per each analog time domain output signal processing is just the subtraction of the jitter components in each frequency bin of the digital frequency domain signal. Thus, the invention provides an efficient removal of jitter components from a digital time domain signal based on an analog time domain output signal of an electronic device under test, when the automatic test equipment is in normal mode of operation.

According to an advantageous embodiment of the invention the amplitude of the lower spur of each of the frequency bins and the amplitude of the upper spur of each of the frequency bins are calculated using a same first parameter of the set of parameters; and the frequency of the lower spur of each of the frequency bins and the frequency of the upper spur of each of the frequency bins are calculated using a same second parameter of the set of parameters.

By these features the removal of the jitter components may be further simplified.

According to an advantageous embodiment of the invention the first parameter corresponds to a peak-to-peak jitter amplitude of a jitter modulation function of the analog-to-digital converter and the second parameter corresponds to a jitter frequency of the jitter modulation function of the analog-to-digital converter.

With the knowledge of the peak-to-peak jitter amplitude of the jitter modulation function of the analog-to-digital converter and of the jitter frequency of the jitter modulation function of the analog-to-digital converter, the impact on each frequency bin, in case the respective frequency bin is filled with a spectral component of the analog time domain output signal, may be predicted.

According to an advantageous embodiment of the invention for each frequency bin the amplitude of the lower spur and the amplitude of the upper spur is calculated based on the formula $$s_{spur\,i}[dBc] = 20 * \log\left(\frac{\pi}{2} f_i T_{jpp}\right),$$

with i=1 . . . I, wherein I is a number of the frequency bins, $f_i$ is the frequency of the i-th frequency bin, $T_{jpp}$ is the peak-to-peak jitter amplitude and $s_{spur\,i}$ is the amplitude of the lower spur and the amplitude of the upper spur of the i-th frequency bin relative to an amplitude of the i-th frequency bin;

wherein for each frequency bin the frequency of the lower spur is calculated based on the formula $f_{spur1}=f_i-f_j/f_i$, wherein $f_{spur1\,i}$ is the frequency of the lower spur of the i-th frequency bin and $f_j$ is the jitter frequency of the jitter modulation function; and wherein for each frequency bin the frequency of the upper spur is calculated based on the formula $f_{spuru\ i}=f_i+f_j/f_i$, wherein $f_{spuru\ i}$ is the frequency of the upper spur of the i-th frequency bin.

Assumed an analog time domain output signal that also consists of a simple sinusoidal signal $s_0(t)$ with a frequency $f_1$ has to be converted with the same sampling clock, the consequence will be that the same jitter modulation function $s_j(t)$ will now generate spurs at different frequencies and a height according to:

$$s_{spur}[dBc] = 20*\log\left(\frac{\pi}{2}\frac{T_{jpp}}{T_1}\right)$$

Note that the spur size changes with respect to the reference tone due to the fact that the application signal has it's spectral component at $f_1=1/T_1$. Therefore, the jitter spectral components are now located at the frequencies:

$$f_{spur}=f_1\pm f_j/f_1$$

With this result, all parameters of the spurs are determined; therefore the spurs can be removed by a simple subtraction without affecting the original application signal.

When the removal procedure is now performed for each frequency bin in which a signal content is detected, each frequency component of the application signal gets removed from its conversion clock jitter disturbance.

According to an advantageous embodiment of the invention the automated test device comprises:
a reference tone signal generator configured for generating a reference tone signal comprising at least one sinusoidal signal component at a given frequency;
a signal processor configured for calculating a jitter modulation function of an analog-to-digital converter of the automated test equipment by applying a Hilbert transform to a jitter modulated reference tone signal, which is the digital frequency domain signal produced by the analog-to-digital converter, when, during a calibration mode of operation of the automated test equipment, the reference tone signal is fed to the analog-to-digital converter as the analog time domain signal; and
a parameter processor configured for determining the set of operating parameters based on the jitter modulation function.

Since the clock jitter disturbance is a purely additive process in which linear combinations of spectral energy are just added, the impact of clock jitter can also be removed again as long as the jitter modulation function is precisely known.

Unfortunately, the jitter generation process occurs in the depth of PLLs of a clock generation integrated circuit (IC) and therefore the jitter modulation function can hardly be measured where it occurs nor it can be easily predicted from theory. In addition the precise measurement of the disturbed high frequency conversion clock that carries the jitter is also difficult since the measurement would generate parasitic effects in the clock signal and would affect the regular performance in a negative way.

However, for the frequently occurring and most disturbing deterministic jitter components a measurement of a jitter modulated reference tone signal is possible in the digital time signal by means of converting a reference tone signal and performing a demodulation of the jitter modulated reference tone signal as the carrier of the jitter modulation function during a calibration mode of operation.

As soon as the jitter modulation function is precisely known all its spectral components can be subtracted from any spectral component of an arbitrary input signal that can be represented in terms of a finite Fourier sum.

It is evident that the jitter calibration using a reference signal works best when the reference tone signal is a pure sinusoidal signal with a frequency as high as possible and the jitter modulation function is a function of only a few or better just one spectral component.

The precise determination of a sinusoidal jitter modulation function from measuring the conversion result of a reference tone signal implies demodulation of the phase.

So if a phase-modulated sinusoidal time domain signal x(t) is given in terms of:

$$x(t)=A\cos(2\pi f_0 t+\eta\cos(2\pi f_j t))=A\cos(\varphi(t))$$

it is a purely real valued function of t. When a suitably imaginary part iy(t) may be constructed that can be added to x(t) such that a transition to the polar form is possible. The resulting complex function z(t) is called the analytical time domain signal of x(t):

$$z(t)=x(\varphi(t))+iy(\varphi(t))=r(t)*e^{i\varphi(t)}$$

When the analytical signal of the phase-modulated signal is generated, one can easily do the demodulation by simply calculating the phase $\varphi(t)$ from z(t).

The generation of an analytical time domain signal is possible with the Hilbert transform. This means, when the Hilbert transform to x(t) is applied, y(t) is determined. For most math libraries such as Matlab z(t) is returned completely during the Hilbert transform step:

$$z(t)=r(t)*e^{i\varphi(t)}=\text{Hilbert}(x(t))$$

In other words the phase of the jitter modulated reference tone signal may be obtained by calculating:

$$\varphi(t)=\arg(\text{Hilbert}(x(t)))$$

By these features the needed set of operating parameters may be determined without the use of external equipment.

According to an advantageous embodiment of the invention the automated test device comprises:
a connecting device connectable to a calibration device, wherein the connecting device is configured, when being connected to the calibration device during a calibration mode of operation, for receiving a reference tone signal comprising at least one sinusoidal signal component at a given frequency from the calibration device and providing the reference tone signal to the analog-to-digital converter as the analog time domain signal;
a signal processor configured for calculating a jitter modulation function of an analog-to-digital converter of the automated test equipment by applying a Hilbert transform to a jitter modulated reference tone signal, which is the digital frequency domain signal produced by the analog-to-digital converter, when, during a calibration mode of operation of the automated test equipment, the reference tone signal is fed to the analog-to-digital converter as the analog time domain signal; and
a parameter processor configured for determining the set of operating parameters based on the jitter modulation function.

In this embodiment the automatic test equipment may determine the set of operating parameter with internal means. However, the reference tone signal needs to be provided by external equipment.

According to an advantageous embodiment of the invention the signal processor is configured for calculating the jitter modulation function by using the formula $s_j(t)=\arg(\text{Hilbert}(x(t)))-2\pi f_0 t=\eta \cos(2\pi f_j t)$, wherein $s_j(t)$ represents the jitter modulation function, $x(t)$ represents the jitter modulated reference tone signal, $f_0$ represents the frequency of the reference tone signal and $f_j$ represents the jitter frequency of the jitter modulation function.

Since:

$$\varphi(t)=2\pi f_0 t+\eta \cos(2\pi f_j t)$$

the obtained phase still contains the linear phase of the carrier signal. Therefore the jitter modulation function $s_j(t)$ may finally be obtained by additionally subtracting the linear reference tone phase:

$$s_j(t)=\arg(\text{Hilbert}(x(t)))-2\pi f_0 t=\eta \cos(2\pi f_j t)$$

where $x(t)$ is the representation of the jitter modulated reference tone signal.

According to an advantageous embodiment of the invention the parameter processor is configured for determining the first parameter and the second parameter of the set of parameters, wherein the first parameter corresponds to a peak-to-peak jitter amplitude of the jitter modulation function of the analog-to-digital converter and wherein the second parameter corresponds to a jitter frequency of the jitter modulation function of the analog-to-digital converter.

According to an advantageous embodiment of the invention the parameter processor is configured for determining the first parameter using the formula $T_{jpp}=\eta/(\pi f_0)$, wherein $T_{jpp}$ represents the peak-to-peak jitter amplitude of the jitter modulation function, $f_0$ represents the frequency of the reference tone signal and $\eta$ represents a jitter modulation index.

The jitter modulation index $\eta$ actually is a well-known function of $f_0$:

$$\eta=\pi * T_{jpp} * f_0$$

This means, $T_{jpp}$ can be precisely determined from the frequency of the reference tone signal:

$$T_{jpp}=\eta/(\pi f_0)$$

According to an advantageous embodiment of the invention the parameter processor is configured for determining the second parameter by a spectral decomposition of the jitter modulation function.

This means one is able to extract all parameters that determine the sinusoidal clock jitter component.

When the jitter modulation function is perceived as a Fourier series too, where the deterministic sinusoidal jitter components are a linear sum of cosine terms, one is even able to apply the extraction procedure to all its components individually.

The computational effort for the jitter removal is limited, since the jitter parameter determination requiring the Hilbert transform needs to be executed only once during a calibration mode of operation of the automated test equipment with a reference tone signal for the desired sampling rate. The jitter cleansing procedure may be performed on the analog time domain output signal's spectrum of the electronic device under test generated by means of a FFT which in most cases is useful anyway when an application signal analysis is requested. The effort per each application signal processing is just the subtraction of the jitter components in each frequency bin of the analog time domain output signal's spectrum of the electronic device under test.

According to an advantageous embodiment of the invention the parameter processor is configured for storing the set of operating parameters into a memory of the automated test equipment.

By this features the calibration may be fully automated.

According to an advantageous embodiment of the invention the automated test device comprises:
 a reference tone signal generator configured for generating a reference tone signal comprising at least one sinusoidal signal component at a given frequency; and
 a connecting device connectable to a calibration device, wherein the connecting device is configured, when being connected to the calibration device during a calibration mode of operation, for transmitting the digital frequency domain signal as a jitter modulated reference tone signal to the calibration device.

In this embodiment the automated test equipment may produce a reference tone signal by internal means. However, the calculation of the set of parameters needs to be done by external means.

According to an advantageous embodiment of the invention the connecting device is configured, when being connected to the calibration device during the calibration mode of operation, for receiving the set of parameters from the calibration device and for storing the set of parameters into the memory.

By this features the calibration may be fully automated.

According to an advantageous embodiment of the invention the automated test device comprises a connecting device connectable to a calibration device according to, wherein the connecting device is configured, when being connected to the calibration device during a calibration mode of operation, for receiving a reference tone signal from the calibration device and providing the reference tone signal to the analog-to-digital converter as the analog time domain signal; and
 transmitting the digital frequency domain signal as a jitter modulated reference tone signal to the calibration device.

According to an advantageous embodiment of the invention the connecting device is configured, when being connected to the calibration device during a calibration mode of operation, for receiving the set of parameters from the calibration device and for storing the set of parameters into the memory.

These features allow storing the set of operating parameters determined by the external calibration device automatically into the memory of the automatic test equipment The object of the invention is achieved in a further aspect by an calibration device for empirically determining a set of operating parameters for an automated test equipment, wherein the calibration device comprises:
 a signal processor configured for calculating a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal; and
 a parameter processor configured for determining the set of operating parameters based on the jitter modulation function.

According to an advantageous embodiment of the invention the calibration device comprises a reference tone signal generator configured for generating a reference tone signal comprising at least one sinusoidal signal component at a given frequency.

Since the clock jitter disturbance is a purely additive process in which linear combinations of spectral energy are just added, the impact of clock jitter can also be removed again as long as the jitter modulation function is precisely known.

Unfortunately, the jitter generation process occurs in the depth of PLLs of a clock generation integrated circuit (IC) and therefore the jitter modulation function can hardly be measured where it occurs nor it can be easily predicted from theory. In addition the precise measurement of the disturbed high frequency conversion clock that carries the jitter is also difficult since the measurement would generate parasitic effects in the clock signal and would affect the regular performance in a negative way.

However, for the frequently occurring and most disturbing deterministic jitter components a measurement of a jitter modulated reference tone signal is possible in the digital time signal by means of converting a reference tone signal and performing a demodulation of the jitter modulated reference tone signal as the carrier of the jitter modulation function during a calibration mode of operation.

As soon as the jitter modulation function is precisely known all its spectral components can be subtracted from any spectral component of an arbitrary input signal that can be represented in terms of a finite Fourier sum.

It is evident that the jitter calibration using a reference signal works best when the reference tone signal is a pure sinusoidal signal with a frequency as high as possible and the jitter modulation function is a function of only a few or better just one spectral component.

The precise determination of a sinusoidal jitter modulation function from measuring the conversion result of a reference tone signal implies demodulation of the phase.

So if a phase-modulated sinusoidal time domain signal x(t) is given in terms of:

$$x(t)=A\cos(2\pi f_0 t+\eta \cos(2\pi f_j t))=A\cos(\varphi(t))$$

it is a purely real valued function of t. When a suitably imaginary part iy(t) may be constructed that can be added to x(t) such that a transition to the polar form is possible. The resulting complex function z(t) is called the analytical time domain signal of x(t):

$$z(t)=x(\varphi(t))+iy(\varphi(t))=r(t)*e^{i\varphi(t)}$$

When the analytical signal of the phase-modulated signal is generated, one can easily do the demodulation by simply calculating the phase $\varphi(t)$ from z(t).

The generation of an analytical time domain signal is possible with the Hilbert transform. This means, when the Hilbert transform to x(t) is applied, y(t) is determined. For most math libraries such as Matlab z(t) is returned completely during the Hilbert transform step:

$$z(t)=r(t)*e^{i\varphi(t)}=\text{Hilbert}(x(t))$$

In other words the phase of the jitter modulated reference tone signal may be obtained by calculating:

$$\varphi(t)=\arg(\text{Hilbert}(x(t)))$$

According to an advantageous embodiment of the invention the signal processor is configured for calculating the jitter modulation function by using the formula $s_j(t)=\arg(\text{Hilbert}(x(t)))-2\pi f_0 t=\eta\cos(2\pi f_j t)$, wherein $s_j(t)$ represents the jitter modulation function, x(t) represents the jitter modulated reference tone signal, $f_0$ represents a frequency of the reference tone signal and $f_j$ represents the jitter frequency of the jitter modulation function.

Since:

$$\varphi(t)=2\pi f_0 t+\eta\cos(2\pi f_j t)$$

the obtained phase still contains the linear phase of the carrier signal. Therefore the jitter modulation function $s_j(t)$ may finally be obtained by additionally subtracting the linear reference tone phase:

$$s_j(t)=\arg(\text{Hilbert}(x(t)))-2\pi f_0 t=\eta\cos(2\pi f_j t)$$

where x(t) is the representation of the jitter modulated reference tone signal.

According to an advantageous embodiment of the invention the calibration device is configured for determining a first parameter and a second parameter of the set of parameters, wherein the first parameter corresponds to a peak-to-peak jitter amplitude of the jitter modulation function of the analog-to-digital converter and wherein the second parameter corresponds to a jitter frequency of the jitter modulation function of the analog-to-digital converter.

According to an advantageous embodiment of the invention the parameter processor is configured for determining the first parameter using the formula $T_{jpp}=\eta/(\pi f_0)$, wherein $T_{jpp}$ represents the peak-to-peak jitter amplitude of the jitter modulation function, $f_0$ represents a frequency of the reference tone signal and $\eta$ represents a jitter modulation index.

The jitter modulation index $\eta$ actually is a well-known function of $f_0$:

$$\eta=\pi*T_{jpp}*f_0$$

This means, $T_{jpp}$ can be precisely determined from the frequency of the reference tone signal:

$$T_{jpp}=\eta/(\pi f_0)$$

According to an advantageous embodiment of the invention the parameter processor is configured for determining the second parameter by a spectral decomposition of the jitter modulation function.

This means one is able to extract all parameters that determine the sinusoidal clock jitter component.

When the jitter modulation function is perceived as a Fourier series too, where the deterministic sinusoidal jitter components are a linear sum of cosine terms, one is even able to apply the extraction procedure to all its components individually.

The computational effort for the jitter removal is limited, since the jitter parameter determination requiring the Hilbert transform need to be executed only once during a calibration mode of operation of the automated test equipment with a reference tone signal for the desired sampling rate. The jitter cleansing procedure may be performed on the analog time domain output signal's spectrum of the electronic device under test generated by means of a FFT which in most cases is useful anyway when an application signal analysis is requested. The effort per each application signal processing is just the subtraction of the jitter components in each frequency bin of the analog time domain output signal's spectrum of the electronic device under test.

According to an advantageous embodiment of the invention the calibration device is configured for storing the set of operating parameters into a memory of the automated test equipment.

By this features the use of the calibration device may be simplified.

According to an advantageous embodiment of the invention the calibration device comprises a connecting device connectable to an automated test equipment in particular to an automated test equipment according to the invention, wherein the connecting device is configured, when being connected to the automated test equipment during a calibration mode of operation of the automated test equipment, for
transmitting the reference tone signal to the automated test equipment; and
receiving the jitter modulated reference tone signal from the automated test equipment.

By these features the use of the calibration device may be further simplified in case it is not an integral part of the automatic test equipment.

According to an advantageous embodiment of the invention the connecting device is configured, when being connected to the automated test equipment during a calibration mode of operation of the automated test equipment, for transmitting the reference tone signal to the automated test equipment.

According to an advantageous embodiment of the invention the connecting device is configured, when being connected to the automated test equipment during a calibration mode of operation of the automated test equipment, for transmitting the set of parameters to the automated test equipment.

By these features the use of the calibration device may be further simplified in case it is not an integral part of the automatic test equipment.

The object of the invention is further achieved by a system comprising an automated test equipment having a connecting device as outlined above and a calibration device having a connecting device as described above.

The object of the invention is further achieved by a method for operating an automated test equipment for analyzing an analog time domain output signal of an electronic device under test, the method comprising the steps of:
converting an analog time domain signal, which is during a normal mode of operation the analog time domain output signal of the electronic device under test, into a digital time domain signal using an analog-to-digital converter obtaining a sample of the analog time domain signal at each sampling point of a plurality of sampling points;
producing a clock signal using a sampling clock, which is fed to the analog-to-digital converter for specifying each sampling point of the plurality of sampling points over time;
converting the digital time domain signal into a digital frequency domain signal using a time-to-frequency converter so that the digital frequency domain signal is represented by frequency bins;
storing a set of empirically determined operating parameters a memory device; and
removing jitter components produced by the analog-to-digital converter in order to produce a cleaned digital frequency domain signal using a jitter components removal module, wherein, based on the set of empirically determined operating parameters, for each frequency bin of the frequency bins an amplitude and a frequency of at least one lower spur having a lower frequency than the respective frequency bin to which it is related to and an amplitude and a frequency of at least one upper spur having a higher frequency than the respective frequency bin to which it is related to are determined, and wherein the lower spur and the upper spur of each frequency bin of the frequency bins are subtracted from the digital frequency domain signal so that the cleaned digital frequency domain signal is produced.

The object of the invention is further achieved by a method for empirically determining a set of operating parameters for an automated test equipment, wherein the method comprises the steps of:
generating a reference tone signal comprising at least one sinusoidal signal component using a reference tone signal generator at a given frequency;
establishing a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal, using a signal processor; and
determining the set of operating parameters based on the jitter modulation function using a parameter processor.

Moreover, the object of the invention is achieved by a computer program for performing, when running on a computer or a processor, one of the inventive methods.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
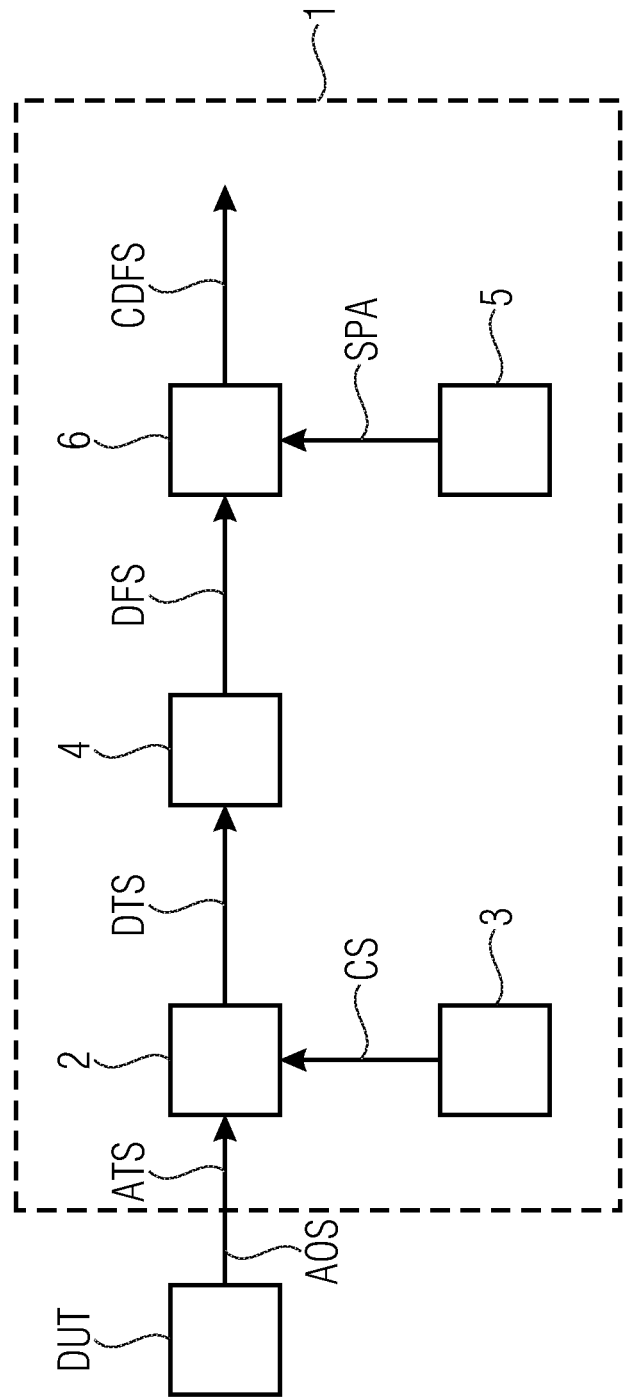
FIG. 1 illustrates a first embodiment of an automated test equipment according to the invention in a schematic view.

FIG. 1 illustrates a first embodiment of an automated test equipment according to the invention in a schematic view.

Automated test equipment for analyzing an analog time domain output signal AOS of an electronic device under test DUT, the automated test equipment 1 comprises:
- an analog-to-digital converter 2 configured for converting an analog time domain signal ATS, which is during a normal mode of operation the analog time domain output signal AOS of the electronic device under test DUT, into a digital time domain signal DTS by obtaining a sample of the analog time domain signal ATS at each sampling point of a plurality of sampling points;
- a sampling clock 3 configured for producing a clock signal CS, which is fed to the analog-to-digital converter 2 for specifying each sampling point of the plurality of sampling points over time;
- a time-to-frequency converter 4 configured for converting the digital time domain signal DTS into a digital frequency domain signal DFS so that the digital frequency domain signal DTS is represented by frequency bins FB1, FB2 (see FIG. 2);
- a memory device 5 configured for storing a set SPA of empirically determined operating parameters; and
- a jitter components removal module 6 for removing jitter components LS1, LS2, US1, US2 (see FIG. 2) produced by the analog-to-digital converter 2 in order to produce a cleaned digital frequency domain signal CDFS, wherein the jitter component removal module 6 is configured for determining, based on the set SPA of empirically determined operating parameters, for each frequency bin FB1, FB2 of the frequency bins FB1, FB2 an amplitude and a frequency of at least one lower spur LS1, LS2 having a lower frequency than the respective frequency bin FB1, FB2 to which it is related to and an amplitude and a frequency of at least one upper spur US1, US2 having a higher frequency than the respective frequency bin FB1, FB2 to which it is related to, wherein the jitter removal module 6 is configured for subtracting the lower spur LS1, LS2 and the upper spur US1, US2 of each frequency bin FB1, FB2 of the frequency bins FB1, FB2 from the digital frequency domain signal DFS so that the cleaned digital frequency domain signal CDFS is produced.

When a jitter modulation of a sampling clock 3 occurs, the sampling points during conversion get modulated in their phase with respect to the ideally regular sampling grid. Thus, the analog-to-digital converter 2 no longer samples the waveform of the analog time domain signal ATS, which is the input signal ATS of the analog-to-digital converter 2, but a different waveform that can be described mathematically by modulating the original analog time domain signal ATS in its phase.

In order to simplify the description, the analog time domain signal ATS and the digital time domain signal DTS is assumed to be a cosine function with frequency $f_0 = 1/T_0$ and amplitude 1:

$$s(t) = \cos(2\pi f_0 t)$$

When samples are taken in presence of a sinusoidal jitter described with a jitter modulation function $s_j(t)$ with a frequency of $f_j$ and a peak-to-peak jitter amplitude of $T_{jpp}$:

$$s_j(t) = \frac{T_{jpp}}{2} \cos(2\pi f_j t)$$

the ideally sampled waveform, sampled across one coherency Period $M*T_0$ with N samples gets disturbed according to a phase modulation:

$$s_s(nT_s) = \sum_{n=0}^{N-1} s\left(nT_s + \pi \frac{T_{jpp}}{T_0} \cos(2\pi f_j nT_s)\right) =$$

$$\sum_{n=0}^{N-1} \cos\left(2\pi f_0 nT_s + \pi \frac{T_{jpp}}{T_0} \cos(2\pi f_j nTs)\right)$$

with $T_s = M*T_0/N$ applied this yields:

$$s_s(nT_s) = \sum_{n=0}^{N-1} \cos\left(2\pi n \frac{M}{N} + \pi \frac{T_{jpp}}{T_0}\cos\left(2\pi\frac{f_i}{f_0}n\frac{M}{N}\right)\right)$$

In order to judge the impact on the spectrum of such a non-ideally sampled waveform, a trigonometric identity may be applied:

$$\cos\left(x + \eta\cos(y)\right) = \sum_{n=-\infty}^{\infty} (-1)^n J_n(\eta)\cos(x \pm ny)$$

with:

$$J_{-n}(\eta) = (-1)^n \cdot J_n(\eta)$$

In the given sampled signal the so called modulation index $\eta = \pi * T_{jpp}/T_0$ may be considered to be small i.e. $\eta \ll 1$, therefore the modulation is called a small band modulation and the Bessel functions of first kind and n-th order $J_n(\eta)$ can be approximated:

$$J_n(\eta) = \frac{1}{n!}\left(\frac{\eta}{2}\right)^n$$

Due to the factorial in the denominator the values of $J_n$ decrease rapidly and therefore only the first few need to be taken into account. In most cases the assumption:

$$J_n(\eta) = 0 \text{ for } n > 1$$

is sufficient to describe the modulation impact adequately. Therefore it is possible to just look at the simple approximation of the sampled signal:

$$s_s(nT_s) = \sum_{n=0}^{N-1} \cos\left(2\pi n \frac{M}{N}\right) + \frac{\pi T_{jpp}}{2T_0}\cos\left(2\pi n\frac{M}{N}\left(1 \pm \frac{f_j}{f_0}\right)\right)$$

This result just means that two spurs appear in a single sided spectrum to the left and right at of the expected carrier at $f_0 \pm f_j/f_0$ with a relative height to the carrier of:

$$s_{spur}[dBc] = 20 * \log\left(\frac{\pi}{2}\frac{T_{jpp}}{T_0}\right)$$

If s(t) is not only a simple sine wave but an arbitrary signal that gets repeated with the coherency period it is possible to express this signal in terms of its Fourier series which is a linear combination of cosine terms added up to a Fourier sum:

$$s(t) = \sum_{k=1}^{N} \frac{a_0}{2} + a_k\cos\left(2\pi k\frac{M}{N} + \varphi_k\right)$$

Therefore, since s(t) is just a linear superposition of cosine functions and all jitter related relationships apply to each of the cosine terms in the Fourier series, the resulting phase modulated conversion signal is therefore composed as follows:

$$s_s(nT_s) \sum_{n=0}^{N-1}\left(\sum_{k=1}^{N}\frac{a_0}{2} + a_k\cos\left(2\pi k\frac{M}{N} + \varphi_k\frac{\pi T_{jpp}}{2T_0}\cos\left(2\pi n\frac{M}{N}\left(1 \pm \frac{f_j}{f_0}\right)\right)\right)\right)$$

In other words, the two jitter spurs LS1 and US1 for FB1 (or LS2 and US2 for FB2) are generated for each spectral component FB1, FB2 of the original analog time domain signal ATS (each cosine term) and superimpose on top of each other in a linear fashion. On the other hand, when the jitter modulation function is a generic periodic signal and is represented with more than one spectral component, another superposition occurs for all jitter modulation components LS1, LS2, US1, US2 in the same way. All these superpositions follow a linear cumulative scheme and thus can be taken into account term by term and are finally summed up to grand total.

Whereas random jitter often is still tolerable since its disturbing energy gets spread over the whole spectral domain, the deterministic jitter is most critical since all its disturbing energy gets concentrated into discrete frequency components LS1, LS2, US1, US2. These discrete frequency components LS1, LS2, US1, US2 appear as significant spurs LS1, LS2, US1, US2 and may reduce the spurious free dynamic range of the conversion dramatically in particular for high frequency conversion signals DTS.

According to the invention such deterministic jitter is removed from the output signal of the analog-to analog digital converter DTS, which is the digital time domain signal DTS, by converting the digital time domain signal DTS into a digit to frequency domain signal DFS so that the digital frequency domain signal DFS is represented by frequency bins FB1 FB2. As stated above it is possible in frequency domain to remove jitter components for each frequency bin FB1, FB2 independently as the jitter components LS1, LS2, US1, US2 of the different frequency bins FB1, FB2 are superimposed.

As stated above the jitter components of each frequency bin FB1, FB2 of the frequency bins FB1, FB2 may be seen as a Fourier series. However, most impact on the measurement have these jitter components LS1, LS2, US1, US2, which are closest to the respective frequency bin FB1, FB2. Therefore, measurements may be improved by removing of just one lower spur LS1, LS2 and by removing of just one upper spur US1, US2 for each of the bins FB1, FB2.

For that purpose the frequency and amplitude of the lower spur LS1, LS2 and the upper spur US1, US2 may be calculated based on an empirically determined set of operating parameters SPA, which may be stored in the memory 5. How such a set of operating parameters SPA may be found will be discussed later in here.

The computational effort for the jitter removal is limited, since jitter cleansing procedure may be performed on the analog frequency domain signal DFS, which corresponds to the analog time domain output signal AOS of the electronic device under test DUT and can be determined by means of a FFT which in most cases is useful anyway when a frequency domain analysis of the analog time domain output signal ATS is requested. The effort per each analog time domain output signal processing is just the subtraction of the jitter components LS1, LS2, US1, US2 in each frequency bin FB1, FB2 of the digital frequency domain signal DFS.

Thus, the invention provides an efficient removal of jitter components LS1, LS2, US1, US2 from a digital time domain output signal DTS based on an analog time domain output signal of an electronic device under test 1, when the automatic test equipment 1 is in normal mode of operation.

According to an advantageous embodiment of the invention the amplitude of the lower spur LS1, LS2 of each of the frequency binsFB1, FB2 and the amplitude of the upper spur US1, US2 of each of the frequency bins FB1, FB2 are calculated using a same first parameter of the set SPA of parameters; and the frequency of the lower spur LS1, LS2 of each of the frequency bins FB1, FB2 and the frequency of the upper spur US1, US2 of each of the frequency bins FB1, FB2 are calculated using a same second parameter of the set SPA of parameters.

By these features the removal of the jitter components LS1, LS2, US1, US2 may be further simplified.

According to an advantageous embodiment of the invention the first parameter corresponds to a peak-to-peak jitter amplitude of a jitter modulation function JMF of the analog-to-digital converter 2 and the second parameter corresponds to a jitter frequency of the jitter modulation function JMF of the analog-to-digital converter 2.

With the knowledge of the peak-to-peak jitter amplitude of the jitter modulation function JMF of the analog-to-digital converter 2 and of the jitter frequency of the jitter modulation function JMF of the analog-to-digital converter 2, the impact on each frequency bin FB1, FB2, in case the respective frequency bin FB1, FB2 is filled with a spectral component of the analog time domain output signal AOS, may be predicted.

According to an advantageous embodiment of the invention for each frequency bin FB1, FB2 the amplitude of the lower spur LS1, LS2 and the amplitude of the upper spur US1, US2 is calculated based on the formula $$s_{spuri}[dBc] = 20 * \log \frac{\pi}{2} f_i T_{jpp},$$

with i=1 . . . I, wherein I is a number of the frequency bins FB1, FB2, $f_i$ is the frequency of the i-th frequency bin FB1, FB2, $T_{jpp}$ is the peak-to-peak jitter amplitude and $s_{spur\ i}$ is the amplitude of the lower spur LS1, LS2 and the amplitude of the upper spur US1, US2 of the i-th frequency bin FB1, FB2 relative to an amplitude of the i-th frequency bin FB1, FB2;

wherein for each frequency bin FB1, FB2 the frequency of the lower spur LS1, LS2 is calculated based on the formula $f_{spurl\ i}=f_i-f_j/f_i$, wherein $f_{spurl\ i}$ is the frequency of the lower spurLS1, LS2 of the i-th frequency bin FB1, FB2 and $f_j$ is the jitter frequency of the jitter modulation function JMF; and wherein for each frequency bin FB1, FB2 the frequency of the upper spur US1, US2 is calculated based on the formula $f_{spuru\ i}=f_i+f_j/f_i$, wherein $f_{spuru\ i}$ is the frequency of the upper spur US1, US2 of the i-th frequency bin FB1, FB2.

Assumed an analog time domain output signal AOS that also consists of a simple sinusoidal signal $s_0(t)$ with a frequency $f_1$ has to be converted with the same sampling clock 3, the consequence will be that the same jitter modulation function $s_j(t)$ will now generate spurs LS and US at different frequencies and a height according to:

$$s_{spur}[dBc] = 20 * \log \left( \frac{\pi}{2} \frac{T_{jpp}}{T_1} \right)$$

Note that the spur size changes with respect to the reference tone due to the fact that the application signal has its spectral component at $f_1=1/T_1$. Therefore, the jitter spectral components are now located at the frequencies:

$$f_{spur}=f_1 \pm f_j/f_1$$

With this result, all parameters of the spurs LS and US are determined for all frequency bins FB; therefore the spurs can be removed by a simple subtraction in the frequency domain without affecting the original application signal AOS.

When the removal procedure is now performed for each frequency bin FB1, FB2 in which a signal content is detected, each frequency component of the application signal AOS gets removed from its conversion clock jitter disturbance.

Figure 2:
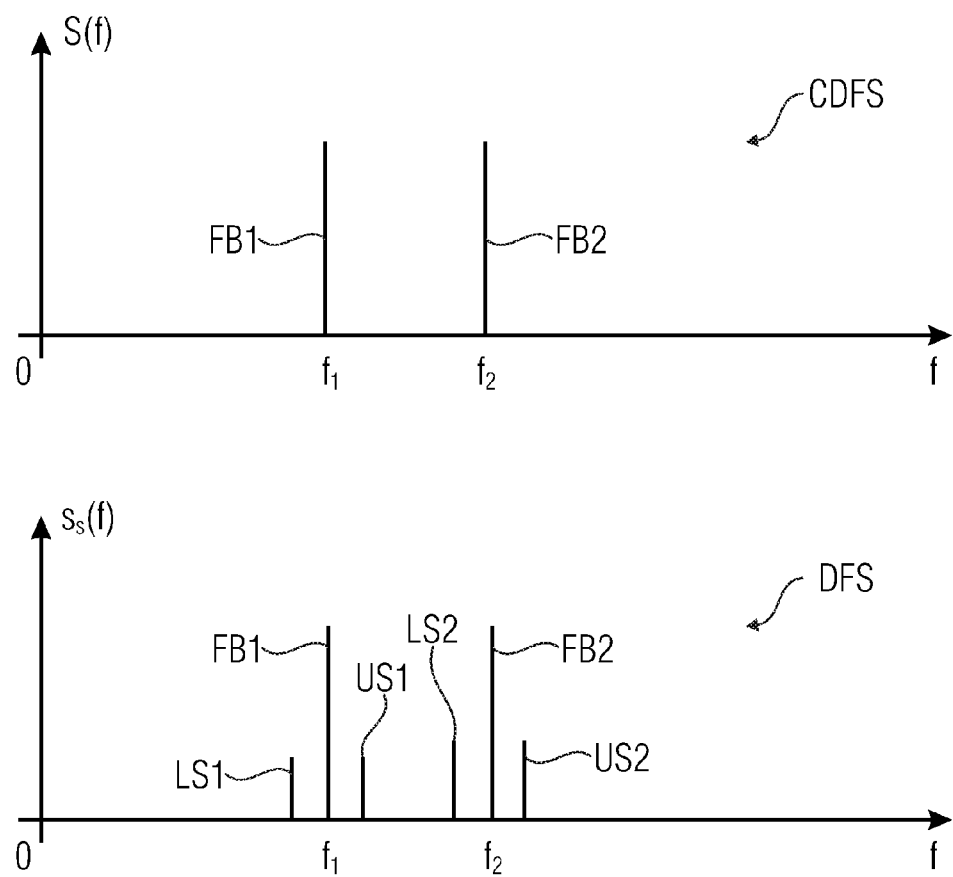
FIG. 2 shows an example of an digital frequency domain signal, which is based on digital time domain signal of an analog-to-digital converter of an automated test equipment according to the invention, and an example of a cleaned digital frequency domain signal, which is an output signal of a jitter components removal module of an automated test equipment according to the invention.

FIG. 2 shows an example of a digital frequency domain signal DFS, which is based on digital time domain signal DTS of an analog-to-digital converter 2 of an automated test equipment 1 according to the invention, and an example of a cleaned digital frequency domain signal CDFS, which is an output signal of a jitter components removal module 6 of an automated test equipment according to the invention.

Figure 3:
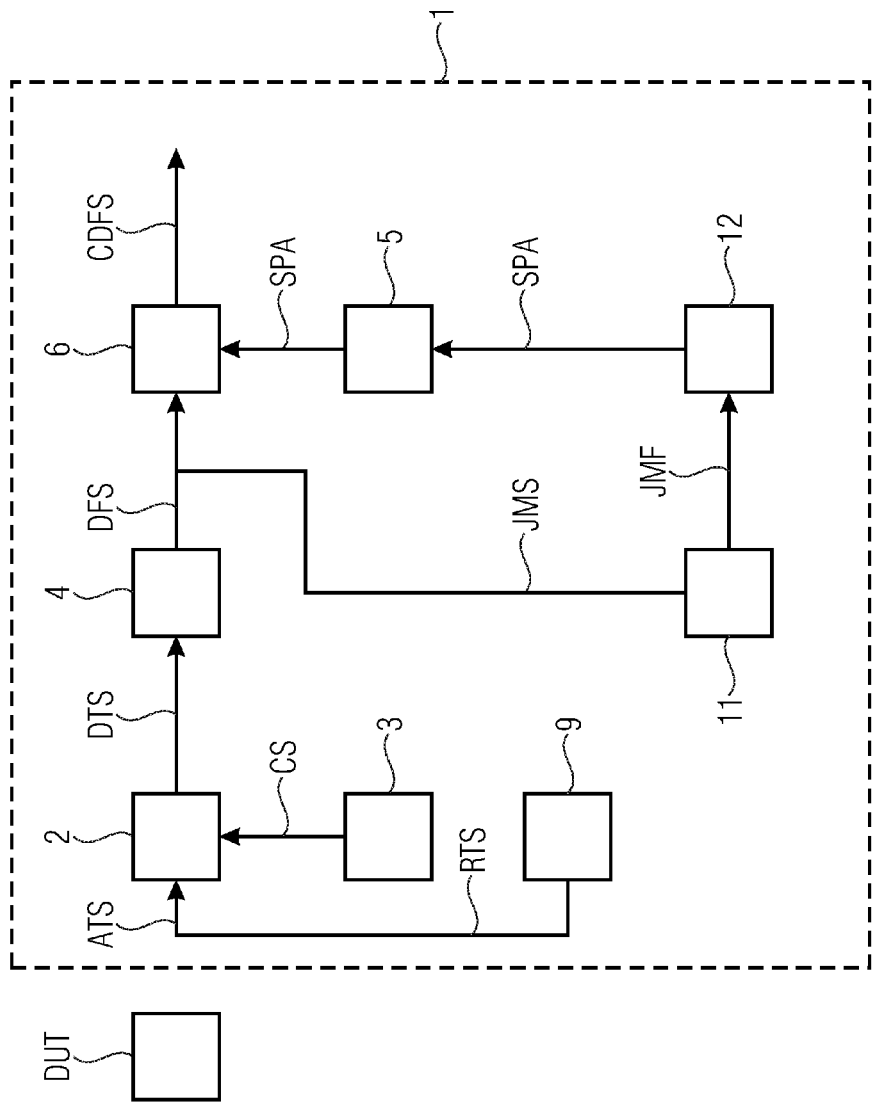
FIG. 3 illustrates a second embodiment of an automated test equipment according to the invention in a schematic view.

FIG. 3 illustrates a second embodiment of an automated test equipment 1 according to the invention in a schematic view.

According to an advantageous embodiment of the invention the automated test device 1 comprises:

a reference tone signal generator 9 configured for generating a reference tone signal RTS comprising at least one sinusoidal signal component at a given frequency;

a signal processor 11 configured for calculating a jitter modulation function JMF of an analog-to-digital converter 2 of the automated test equipment 1 by applying a Hilbert transform to a jitter modulated reference tone signal JMS, which is the digital frequency domain signal DFS produced by the analog-to-digital converter 2, when, during a calibration mode of operation of the automated test equipment 1, the reference tone signal RTS is fed to the analog-to-digital converter 2 as the analog time domain signal ATS; and a parameter processor 12 configured for determining the set SPA of operating parameters based on the jitter modulation function JMF.

Since the clock jitter disturbance is a purely additive process in which linear combinations of spectral energy are just added, the impact of clock jitter can also be removed again in the frequency domain as long as the jitter modulation function is precisely known.

Unfortunately, the jitter generation process occurs in the depth of PLLs of a clock generation integrated circuit (IC) and therefore the jitter modulation function JMF can hardly be measured where it occurs nor it can be easily predicted from theory. In addition the precise measurement of the disturbed high frequency conversion clock that carries the jitter is also difficult since the measurement would generate parasitic effects in the clock signal CS and would affect the regular performance in a negative way.

However, for the frequently occurring and most disturbing deterministic jitter components a measurement of a jitter modulated reference tone signal JMS is possible in the digital time signal DTS by means of converting a reference tone signal RTS and performing a demodulation of the jitter modulated reference tone JMS signal as the carrier of the jitter modulation function JMF during a calibration mode of operation.

As soon as the jitter modulation function JMF is precisely known all its spectral components can be subtracted from any spectral component of an arbitrary input signal that can be represented in terms of a finite Fourier sum.

It is evident that the jitter calibration using a reference signal works best when the reference tone signal is a pure sinusoidal signal with a frequency as high as possible and the jitter modulation function is a function of only a few or better just one spectral component.

The precise determination of a sinusoidal jitter modulation function JMF from measuring the conversion result of a reference tone signal RTS implies demodulation of the phase.

So if a phase-modulated sinusoidal time domain signal x(t) is given in terms of:

$$x(t)=A\cos(2\pi f_0 t+\eta\cos(2\pi f_j t))=A\cos(\varphi(t))$$

it is a purely real valued function of t. When a suitably imaginary part iy(t) may be constructed that can be added to x(t) such that a transition to the polar form is possible. The resulting complex function z(t) is called the analytical time domain signal of x(t):

$$z(t)=x(\varphi(t))+iy(\varphi(t))=r(t)*e^{i\varphi(t)}$$

When the analytical signal of the phase-modulated signal is generated, one can easily do the demodulation by simply calculating the phase $\varphi(t)$ from z(t).

The generation of an analytical time domain signal is possible with the Hilbert transform. This means, when the Hilbert transform to x(t) is applied, y(t) is determined. For most math libraries such as Matlab z(t) is returned completely during the Hilbert transform step:

$$z(t)=r(t)*e^{i\varphi(t)}=\text{Hilbert}(x(t))$$

In other words the phase of the jitter modulated reference tone signal JMS may be obtained by calculating:

$$\varphi(t)=\arg(\text{Hilbert}(x(t)))$$

By these features the needed set SPA of operating parameters may be determined without the use of external equipment.

According to an advantageous embodiment of the invention the signal processor 11 is configured for calculating the jitter modulation function JMF by using the formula $s_j(t)=(\arg(\text{Hilbert}(x(t)))-2\pi f t)=\eta\cos 2\pi f_j(t)$, wherein $s_j(t)$ represents the jitter modulation function JMF, x(t) represents the jitter modulated reference tone signal JMS, $f_0$ represents the frequency of the reference tone signal RTS and $f_j$ represents the jitter frequency of the jitter modulation function JMF. Since:

$$\varphi(t)=2\pi f_0 t+_{\eta\cos(2\pi f_j t)}$$

the obtained phase still contains the linear phase of the carrier signal. Therefore the jitter modulation function $s_j(t)$ may finally be obtained by additionally subtracting the linear reference tone phase:

$$s_j(t)=\arg(\text{Hilbert}(x(t)))-2\pi f_0 t=\eta\cos(2\pi f_j t)$$

where x(t) is the representation of the jitter modulated reference tone signal JMS.

According to an advantageous embodiment of the invention the parameter processor 12 is configured for determining a first parameter and a second parameter of the set of parameters SPA, wherein the first parameter corresponds to a peak-to-peak jitter amplitude of the jitter modulation function JMF of the analog-to-digital converter 2 and wherein the second parameter corresponds to a jitter frequency of the jitter modulation function JMF of the analog-to-digital converter 2.

According to an advantageous embodiment of the invention the parameter processor 12 is configured for determining the first parameter using the formula $T_{jpp}=\eta/\pi f_0$, wherein $T_{jpp}$ represents the peak-to-peak jitter amplitude of the jitter modulation function JMF, $f_0$ represents the frequency of the reference tone signal RTS and $\eta$ represents a jitter modulation index.

The jitter modulation index $\eta$ actually is a well-known function of $f_0$:

$$\eta=\pi*T_{jpp}*f_0$$

This means, $T_{jpp}$ can be precisely determined from the frequency of the reference tone signal:

$$T_{jpp}=\eta/(\pi f_0)$$

According to an advantageous embodiment of the invention the parameter processor 12 is configured for determining the second parameter by a spectral decomposition of the jitter modulation function JMF.

This means one is able to extract all parameters that determine the sinusoidal clock jitter component.

When the jitter modulation function is perceived as a Fourier series too, where the deterministic sinusoidal jitter components are a linear sum of cosine terms, one is even able to apply the extraction procedure to all its components individually.

The computational effort for the jitter removal is limited, since the jitter parameter determination requiring the Hilbert transform need to be executed only once during a calibration mode of operation of the automated test equipment 1 with a reference tone signal RTS for the desired sampling rate. The jitter cleansing procedure may be performed on the analog time domain output signal's AOS spectrum of the electronic device under test DUT generated by means of a FFT which in most cases is useful anyway when an application signal AOS analysis is requested. The effort per each application signal AOS processing is just the subtraction of the jitter components L1, L2, US1, US2 in each frequency bin FB1, FB2 of the analog time domain output signal's AOS spectrum of the electronic device under test DUT.

According to an advantageous embodiment of the invention parameter processor 12 is configured for storing the set SPA of operating parameters into a memory 5 of the automated test equipment 1.

By this features the use the calibration may be simplified.

Figure 4:
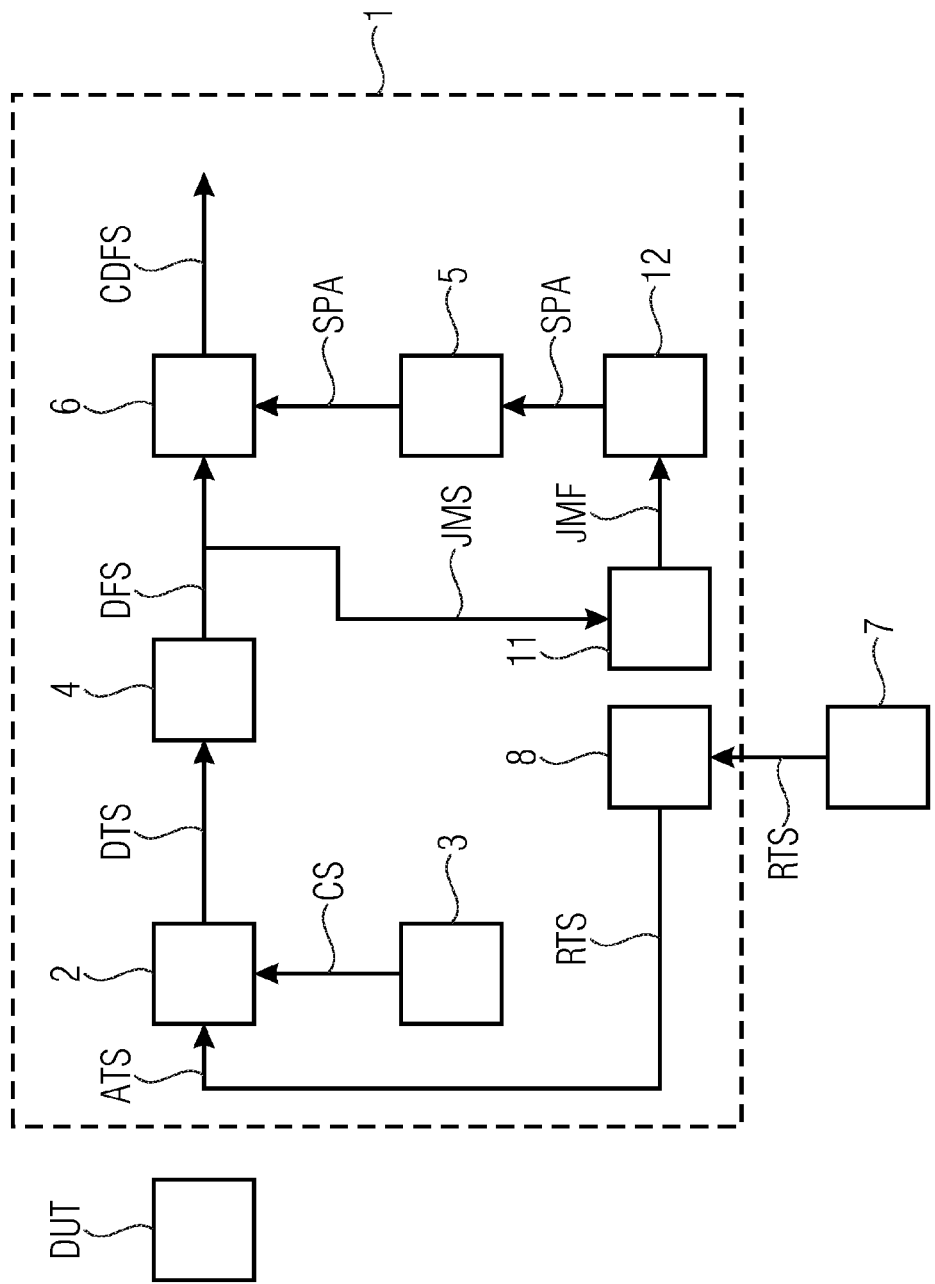
FIG. 4 illustrates a fourth embodiment of an automated test equipment according to the invention in a schematic view.

FIG. 4 illustrates a fifth embodiment of an automated test equipment 1 according to the invention in a schematic view.

According to an advantageous embodiment of the invention the automated test device 1 comprises:
  a connecting device 8 connectable to a calibration device 7, wherein the connecting device 8 is configured, when being connected to the calibration device 7 during a calibration mode of operation, for receiving a reference tone signal RTS comprising at least one sinusoidal signal component at a given frequency from the calibration device 7 and providing the reference tone signal RTS to the analog-to-digital converter 2 as the analog time domain signal ATS;
  a signal processor 11 configured for calculating a jitter modulation function JMF of an analog-to-digital converter 2 of the automated test equipment 1 by applying a Hilbert transform to a jitter modulated reference tone signal JMS, which is the digital frequency domain signal DFS produced by the analog-to-digital converter 2, when, during a calibration mode of operation of the automated test equipment 1, the reference tone signal RTS is fed to the analog-to-digital converter 2 as the analog time domain signal ATS; and a parameter processor 12 configured for determining the set SPA of operating parameters based on the jitter modulation function JMF.

In this embodiment the automatic test equipment 1 may determine the set SPA of operating parameter with internal means. However, the reference tone signal RTS needs to be provided by external equipment 7. The signal processor 11 and a parameter processor 12 may be configured as explained with respect to FIG. 3.

By the connecting device 8 the calibration device 7 may be easily connected to the automated test equipment in order to determine the needed set SPA of operating parameters.

According to an advantageous embodiment of the invention (not shown in the figures) the automated test device 1 comprises:

a reference tone signal generator 9 configured for generating a reference tone signal RTS comprising at least one sinusoidal signal component at a given frequency; and a connecting device 8 connectable to a calibration device 7, wherein the connecting device 8 is configured, when being connected to the calibration device 7 during a calibration mode of operation, for transmitting the digital frequency domain signal DFS as a jitter modulated reference tone signal JMS to the calibration device 7.

In this embodiment the automated test equipment 1 may produce a reference tone signal CS by internal means. However, the calculation of the set of parameters SPA needs to be done by external means 7.

The reference tone signal generator 9 may be configured as explained with respect to FIG. 3.

By the connecting device 8 the calibration device 7 may be easily connected to the automated test equipment 1 in order to determine the needed set SPA of operating parameters.

Figure 5:
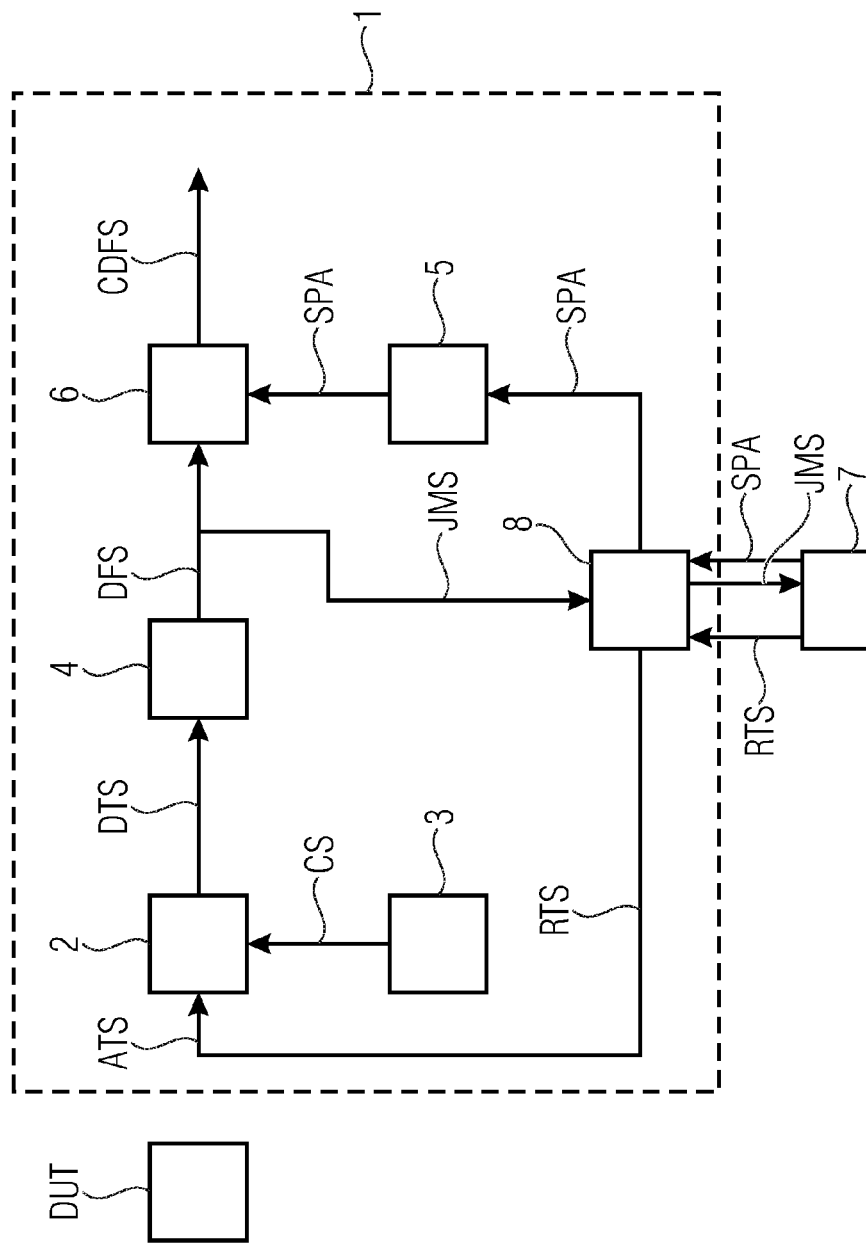
FIG. 5 illustrates a fifth embodiment of an automated test equipment according to the invention in a schematic view.

FIG. 5 illustrates a fifth embodiment of an automatic test equipment 1 according to the invention in a schematic view.

According to an advantageous embodiment of the invention the automated test device 1 comprises:

a connecting device 8 connectable to a calibration device 7, wherein the connecting device 8 is configured, when being connected to the calibration device 7 during a calibration mode of operation, for receiving a reference tone signal RTS from the calibration device 7 and providing the reference tone signal RTS to the analog-to-digital converter 2 as the analog time domain signal ATS;

transmitting the digital time domain signal DTS as a jitter modulated reference tone signal JMS to the calibration device 7.

According to an advantageous embodiment of the invention the connecting device 8 is configured, when being connected to the calibration device 7 during the calibration mode of operation, for receiving the set of parameters SPA from the calibration device 7 and for storing the set of parameters SPA into the memory 5.

Figure 6:
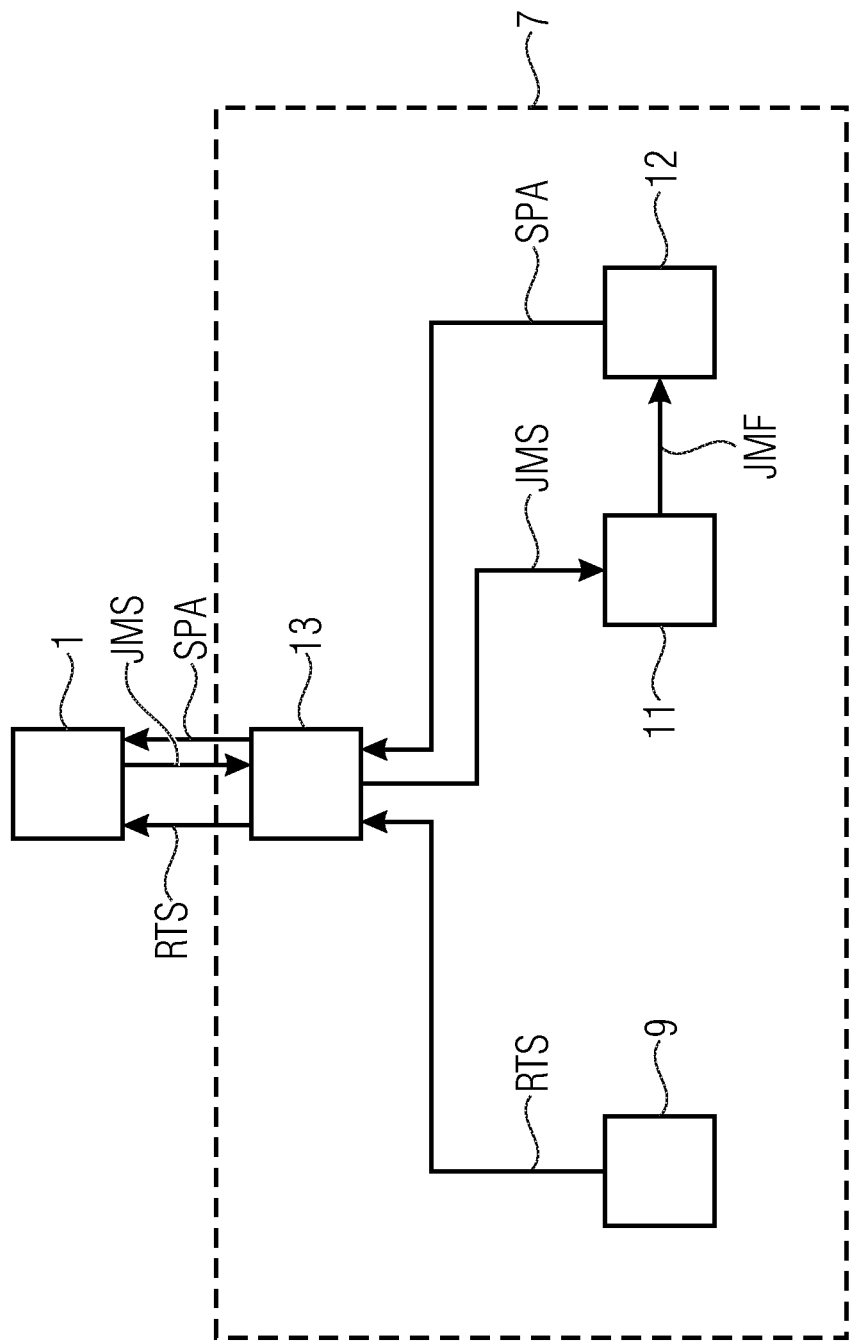
FIG. 6 illustrates an embodiment of a calibration device according to the invention in a schematic view.

These features allow storing the set of operating parameters determined by the external calibration device automatically into the memory of the automatic test equipment FIG. 6 illustrates an embodiment of a calibration device 7 according to the invention in a schematic view.

The calibration device 7 comprises:

a signal processor 11 configured for calculating a jitter modulation function JMF of an analog-to-digital converter 2 of the automated test equipment 1 by applying a Hilbert transform to a jitter modulated reference tone signal JMS, which is a digital time frequency signal DFS produced by the analog-to-digital converter 2, when, during a calibration mode of operation of the automated test equipment 1, the reference tone signal RTS is fed to the analog-to-digital converter 2 as an analog time domain signal ATS; and a parameter processor 12 configured for determining the set SPA of operating parameters based on the jitter modulation function JMF.

According to an advantageous embodiment of the invention the concentration device comprises a reference tone signal generator 9 configured for generating a reference tone signal RTS comprising at least one sinusoidal signal component at a given frequency.

Since the clock jitter disturbance is a purely additive process in which linear combinations of spectral energy are just added, the impact of clock jitter can also be removed again in the frequency domain as long as the jitter modulation function is precisely known.

Unfortunately, the jitter generation process occurs in the depth of PLLs of a clock generation integrated circuit (IC) and therefore the jitter modulation function JMF can hardly be measured where it occurs nor it can be easily predicted from theory. In addition the precise measurement of the disturbed high frequency conversion clock that carries the jitter is also difficult since the measurement would generate parasitic effects in the clock signal CS and would affect the regular performance in a negative way.

However, for the frequently occurring and most disturbing deterministic jitter components a measurement of a jitter modulated reference tone signal JMS is possible in the digital time signal DTS by means of converting a reference tone signal RTS and performing a demodulation of the jitter modulated reference tone JMS signal as the carrier of the jitter modulation function JMF during a calibration mode of operation.

As soon as the jitter modulation function JMF is precisely known all its spectral components can be subtracted from any spectral component of an arbitrary input signal that can be represented in terms of a finite Fourier sum.

It is evident that the jitter calibration using a reference signal works best when the reference tone signal is a pure sinusoidal signal with a frequency as high as possible and the jitter modulation function is a function of only a few or better just one spectral component.

The precise determination of a sinusoidal jitter modulation function JMF from measuring the conversion result of a reference tone signal RTS implies demodulation of the phase.

So if a phase-modulated sinusoidal time domain signal x(t) is given in terms of:

$$x(t)=A\cos(2\pi f_0 t+\eta\cos(2\pi f_j t))=A\cos(\varphi(t))$$

it is a purely real valued function of t. When a suitably imaginary part iy(t) may be constructed that can be added to x(t) such that a transition to the polar form is possible. The resulting complex function z(t) is called the analytical time domain signal of x(t):

$$z(t)=x(\varphi(t))+iy(\varphi(t))=r(t)*e^{i\varphi(t)}$$

When the analytical signal of the phase-modulated signal is generated, one can easily do the demodulation by simply calculating the phase φ(t) from z(t).

The generation of an analytical time domain signal is possible with the Hilbert transform. This means, when the Hilbert transform to x(t) is applied, y(t) is determined. For most math libraries such as Matlab z(t) is returned completely during the Hilbert transform step:

$$z(t)=r(t)*e^{i\varphi(t)}=\text{Hilbert}(x(t))$$

In other words the phase of the jitter modulated reference tone signal JMS may be obtained by calculating:

$$\varphi(t)=\arg(\text{Hilbert}(x(t)))$$

According to an advantageous embodiment of the invention the signal processor 11 is configured for calculating the jitter modulation function JMF by using the formula $s_j(t)= (\arg(\text{Hilbert}(x(t)))-2\pi f_0 t = \eta \cos 2\pi f_j t$, wherein $s_j(t)$ represents the jitter modulation function JMF, x(t) represents the jitter modulated reference tone signal JMS, $f_0$ represents the frequency of the reference tone signal RTS and $f_j$ represents the jitter frequency of the jitter modulation function JMF. Since:

$$\varphi(t)=2\pi f_0 t+\eta \cos(2\pi f_j t)$$

the obtained phase still contains the linear phase of the carrier signal. Therefore the jitter modulation function $s_j(t)$ may finally be obtained by additionally subtracting the linear reference tone phase:

$$s_j(t)=\arg(\text{Hilbert}(x(t)))-2\pi f_0 t=\eta \cos(2\pi f_j t)$$

where x(t) is the representation of the jitter modulated reference tone signal JMS.

According to an advantageous embodiment of the invention the calibration device 7 is configured for determining a first parameter and a second parameter of the set of parameters SPA, wherein the first parameter corresponds to a peak-to-peak jitter amplitude of the jitter modulation function JMF of the analog-to-digital converter 2 and wherein the second parameter corresponds to a jitter frequency of the jitter modulation function JMF of the analog-to-digital converter 2.

According to an advantageous embodiment of the invention the parameter processor 12 is configured for determining the first parameter using the formula $T_{jpp}=\eta/\pi f_0$, wherein $T_{jpp}$ represents the peak-to-peak jitter amplitude of the jitter modulation function JMF, $f_0$ represents the frequency of the reference tone signal RTS and η represents a jitter modulation index.

The jitter modulation index η actually is a well-known function of $f_0$:

$$\eta=\pi*T_{jpp}f_0$$

This means, $T_{jpp}$ can be precisely determined from the frequency of the reference tone signal:

$$T_{jpp}=\eta/(\pi f_0)$$

According to an advantageous embodiment of the invention the parameter processor 12 is configured for determining the second parameter by a spectral decomposition of the jitter modulation function JMF.

This means one is able to extract all parameters that determine the sinusoidal clock jitter component.

When the jitter modulation function is perceived as a Fourier series too, where the deterministic sinusoidal jitter components are a linear sum of cosine terms, one is even able to apply the extraction procedure to all its components individually.

The computational effort for the jitter removal is limited, since the jitter parameter determination requiring the Hilbert transform need to be executed only once during a calibration mode of operation of the automated test equipment 1 with a reference tone signal RTS for the desired sampling rate. The jitter cleansing procedure may be performed on the analog time domain output signal's AOS spectrum of the electronic device under test DUT generated by means of a FFT which in most cases is useful anyway when an application signal AOS analysis is requested. The effort per each application signal AOS processing is just the subtraction of the jitter components L1, L2, US1, US2 in each frequency bin FB1, FB2 of the analog time domain output signal's AOS spectrum of the electronic device under test DUT.

According to an advantageous embodiment of the invention the calibration device 7 is configured for storing the set SPA of operating parameters into a memory 5 of the automated test equipment 1.

By this features the use of the calibration device 7 may be simplified.

According to an advantageous embodiment of the invention the calibration device 7 comprises a connecting device 13 connectable to an automated test equipment 1, in particular to an automated test equipment 1 according to the invention, wherein the connecting device 13 is configured, when being connected to the automated test equipment 1 during a calibration mode of operation of the automated test equipment 1, for transmitting the reference tone signal RTS to the automated test equipment 1;

receiving the jitter modulated reference tone signal JMS from the automated test equipment 1.

By these features the use of the calibration device 7 may be further simplified in case it is not an integral part of the automatic test equipment 1.

According to an advantageous embodiment of the invention the connecting device 13 is configured, when being connected to the automated test equipment 1 during a calibration mode of operation of the automated test equipment 1, for transmitting the reference tone signal RTS to the automated test equipment 1.

According to an advantageous embodiment of the invention the connecting device 13 is configured, when being connected to the automated test equipment 1 during a calibration mode of operation of the automated test equipment 1, for transmitting the set SPA of parameters to the automated test equipment 1.

By these features the use of the calibration device 7 may be further simplified in case it is not an integral part of the automatic test equipment.

Figure 7:
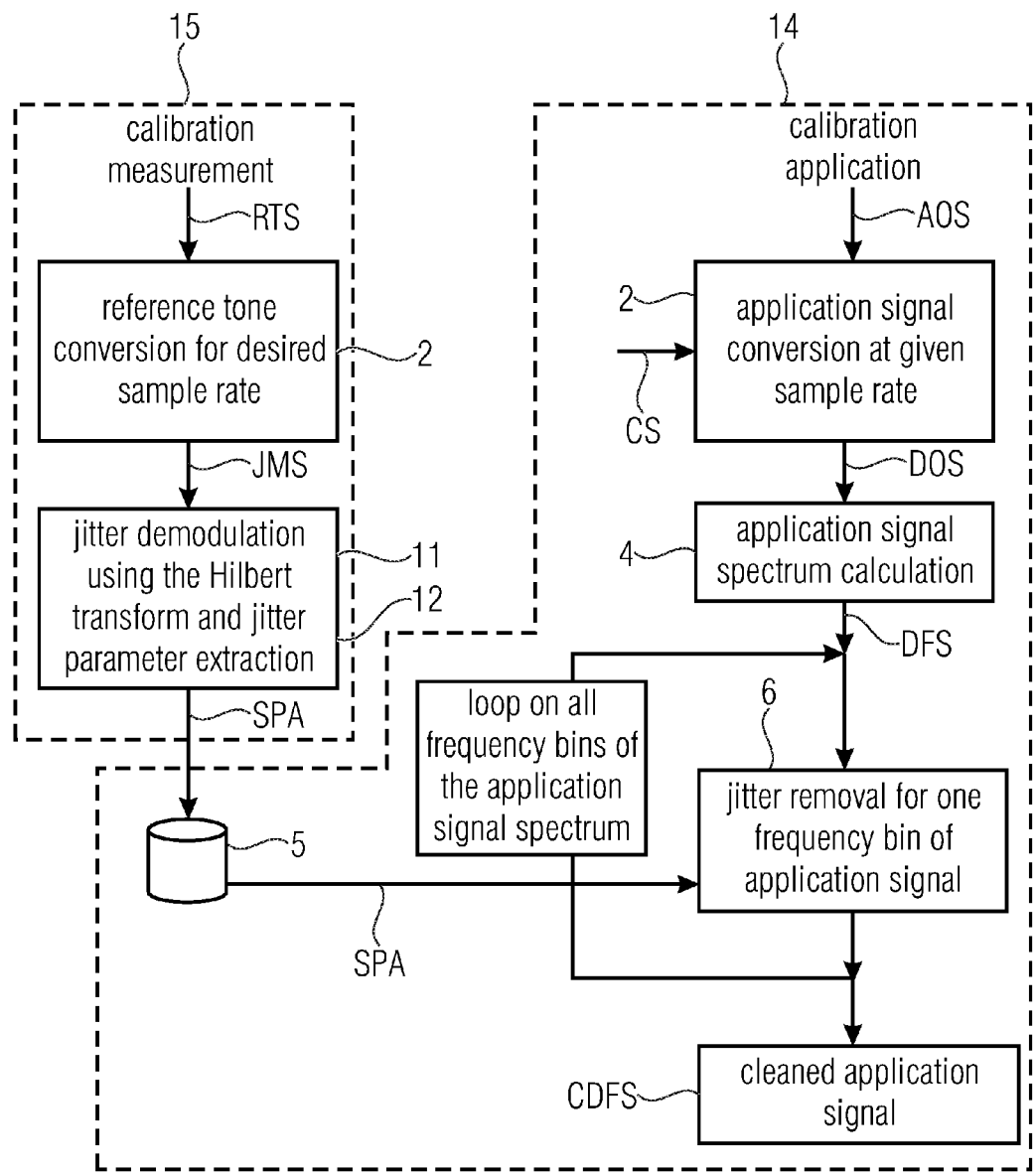
FIG. 7 illustrates an embodiment of a method, according to the invention, for operating an automated test equipment in a schematic view and an embodiment of a method, according to the invention, for empirically determining a set of operating parameters for an automatic test equipment.

FIG. 7 illustrates an embodiment of a method 14, according to the invention, for operating an automated test equipment 1 in a schematic view and an embodiment of a method 15, according to the invention, for empirically determining a set of operating parameters SPA for an automatic test equipment 1.

The method 14 comprises the steps of:

converting an analog time domain signal ATS, which is during a normal mode of operation the analog time domain output signal AOS of the electronic device under test DUT, into a digital time domain signal DTS using an analog-to-digital converter 2 obtaining a sample of the analog time domain signal ATS at each sampling point of a plurality of sampling points;

producing a clock signal CS using a sampling clock 3, which is fed to the analog-to-digital converter 2 for specifying each sampling point of the plurality of sampling points over time;

converting the digital time domain signal DTS into a digital frequency domain signal DFS using a time-to-frequency converter 4 so that the digital frequency domain signal DFS is represented by frequency bins FB1, FB2;

storing a set SPA of empirically determined operating parameters a memory device 5; and removing jitter components LS1, LS2, US1, US2 produced by the analog-to-digital converter 2 in order to produce a cleaned digital frequency domain signal CDFS using a jitter components removal module 6, wherein, based on the set SPA of empirically determined operating parameters, for each frequency bin FB1, FB2 of the frequency bins FB1, FB2 an amplitude and a frequency of at least one lower spur LS1, LS2 having a lower frequency than the respective frequency bin FB1, FB2 to which it is related to and an amplitude and a frequency of at least one upper spur US1, US2 having a higher frequency than the respective frequency bin FB1, FB2 to which it is related to are determined, and wherein the lower spur LS1, LS2 and the upper spur US1, US2 of each frequency bin FB1, FB2 of the frequency bins FB1, FB2 are subtracted from the digital frequency domain signal DFS so that the cleaned digital frequency domain signal CDTS is produced.

The method 15 comprises the steps of:

generating a reference tone signal RTS comprising at least one sinusoidal signal component at a given frequency using a reference tone signal generator 9;

establishing a jitter modulation function JMF of an analog-to-digital converter 2 of the automated test equipment 1 by applying a Hilbert transform to a jitter modulated reference tone signal JMS, which is a digital frequency domain signal DFS produced by the analog-to-digital converter 2, when, during a calibration mode of operation of the automated test equipment 1, the reference tone signal RTS is fed to the analog-to-digital converter 2 as an analog time domain signal ATS, using a signal processor 11; and determining the set SPA of operating parameters based on the jitter modulation function JMF using a parameter processor 12.

Figure 8:
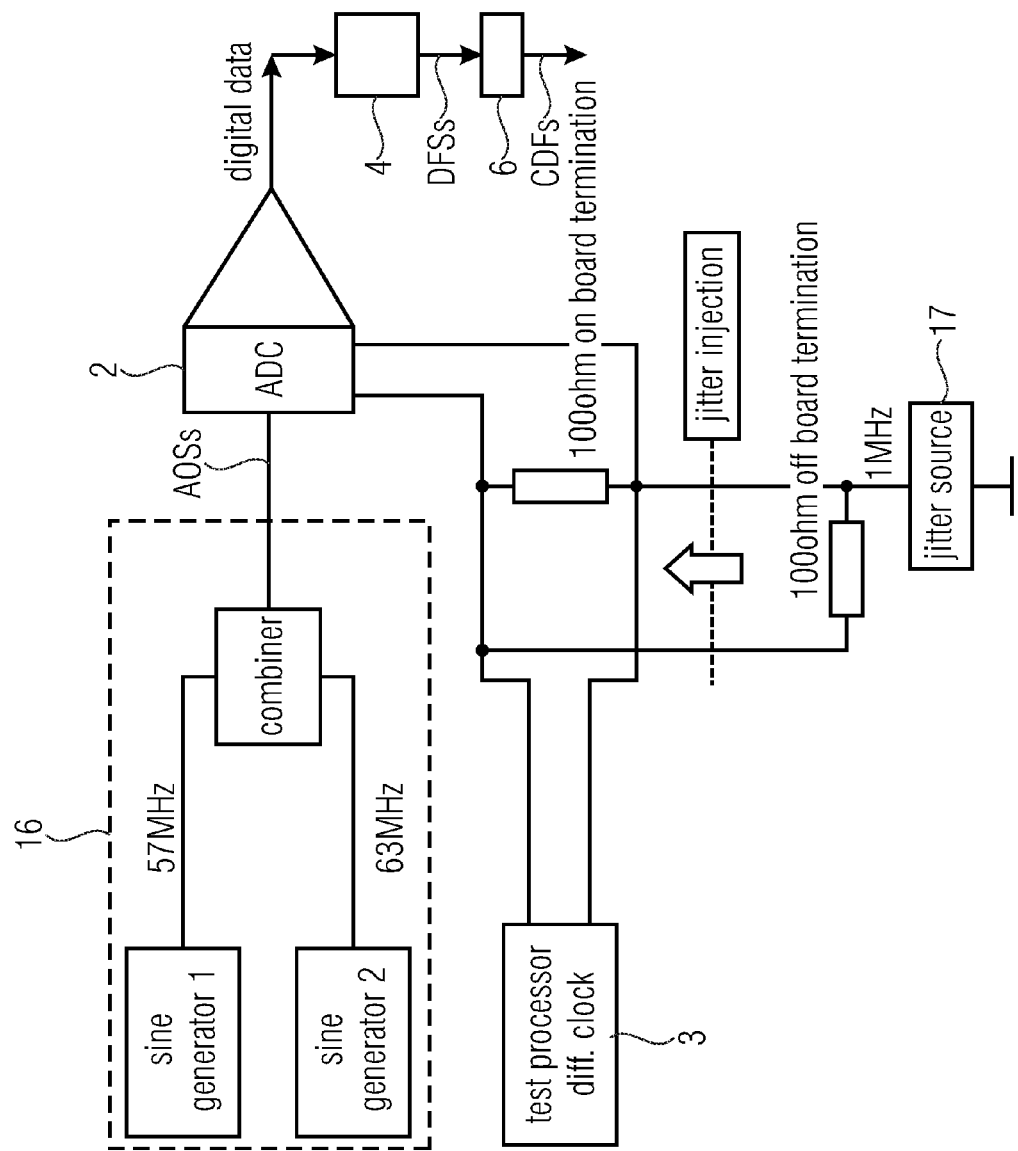
FIG. 8 illustrates a setup for validation of the jitter calibration concept according to the invention in a schematic view.

FIG. 8 illustrates a setup for validation of the jitter calibration concept according to the invention in a schematic view.

For validation of the jitter calibration concept a dedicated setup was created using an automated test equipment high speed digitizer instrument containing a 250 Msps 16 bit analog-to-digital converter 2. The set up comprises an analog time domain output signal simulator 16 having a first sine generator and a second sine generator The outputs of two pure sine wave generators generating a 57 MHz and a 63 MHz tone respectively were combined to form a simulated signal AOSs as it may occur during device test. This signal AOSs was routed to the analog input of the digitizer instrument 2 running at a data rate of 150 Msps. The frequencies of the signal AOSs were chosen to be coherent with the sample rate; this means the accurate numbers were 56.996154785 MHz and 63.002014160 MHz respectively. The jitter frequency however was chosen to be 1 MHz exactly, resulting in a non-coherent jitter.

A branch-off cable was attached to the termination resistor at the clock input of the analog-to digital converter 2 to obtain a precisely controlled jitter injection capability into the conversion clock. The branch-off cable was terminated at the other end and a jitter source 17 was attached to one leg of the differential termination, injecting common mode noise which gets translated into exaggerated conversion clock jitter. The jitter source was programmed to inject a 1 MHz sinusoidal jitter.

In a first step the reference measurement was taken with the 57 MHz sine wave as a single tone signal and the 63 MHz tone was turned off. The jitter frequency and the amplitude was extracted from this reference measurement according to the jitter demodulation method deploying the Hilbert transform. The jitter modulation function was precisely extracted with a 1 MHz jitter frequency and a 3.7 ps pk-pk amplitude.

In a next step these jitter parameters were used to calculate the jitter caused for each frequency bin FB1, FB2 and the induced jitter LS1, LS2, US1, US2 for all bins FB1, FB2 in the spectrum was removed according to their per bin amplitude and frequency. After the execution of the jitter removal procedure the injected jitter LS1, LS2, US1, US2 was no longer visible and the dual tone signal was obtained in its original form. Only a small amount of processing artifacts that are all smaller than −80 dB and thus negligible were obtained. It therefore can be concluded, that the jitter calibration concept is working properly.

Figure 9:
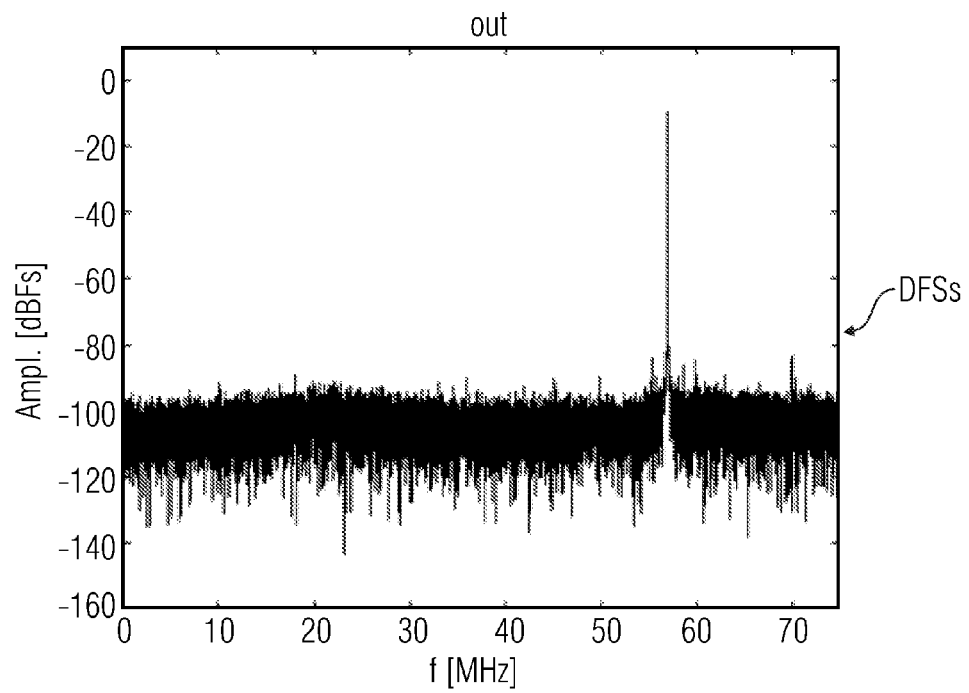
FIG. 9 shows a digital frequency signal based on the simulated analog time domain output signal having a frequency of 57 MHz without jitter injected.

FIG. 9 shows the digital frequency signal DFSs based on the simulated analog time domain output signal AOSs having a frequency of 57 MHz without jitter injected.

Figure 10:
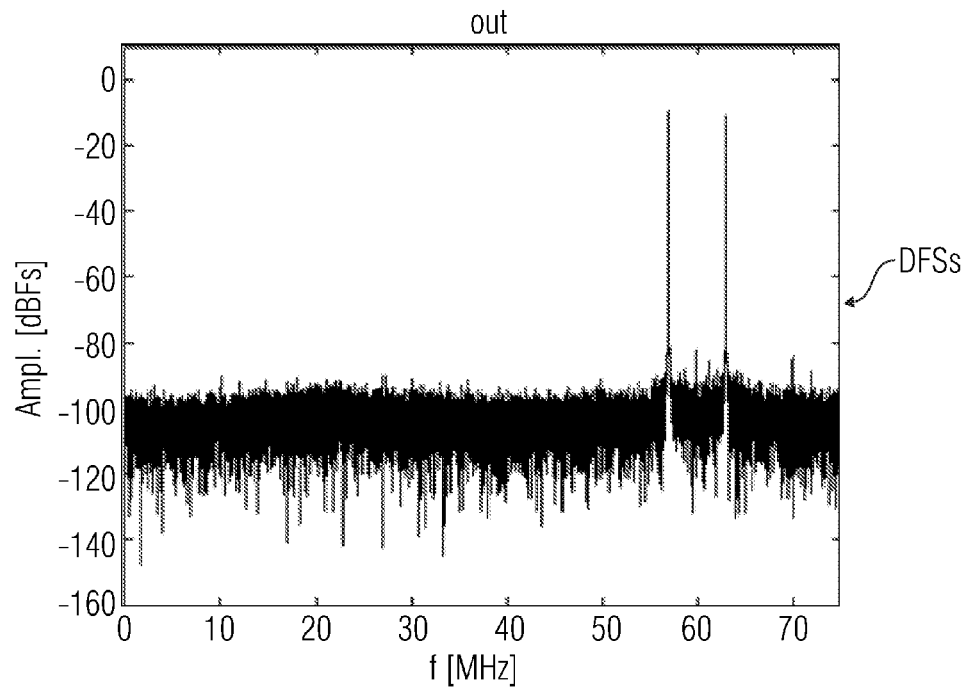
FIG. 10 shows a digital frequency signal based on the simulated analog time domain output signal having a first frequency of 57 MHz and a second frequency of 63 MHz without jitter injected.

FIG. 10 shows the digital frequency signal DFSs based on the simulated analog time domain output signal AOSs having a first frequency of 57 MHz and a second frequency of 63 MHz without jitter injected.

Figure 11:
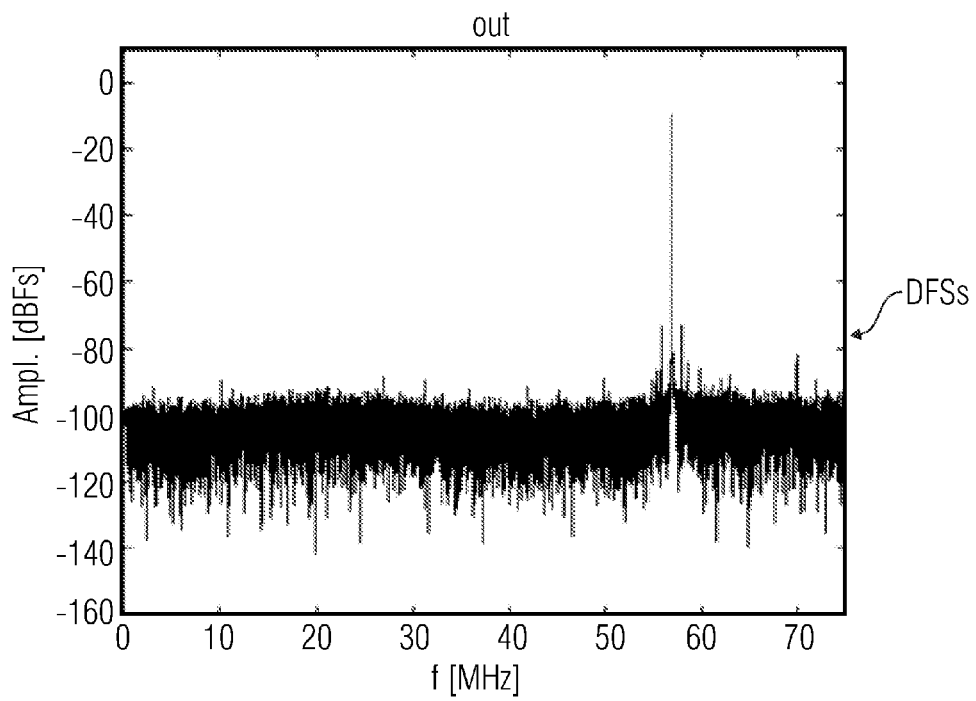
FIG. 11 shows a digital frequency signal based on the simulated analog time domain output signal having a frequency of 57 MHz with jitter having a frequency of 1 MHz injected, which was used as a reference measurement during jitter calibration.

FIG. 11 shows the digital frequency signal DFSs based on the simulated analog time domain output signal AOSs having a frequency of 57 MHz with jitter having a frequency of 1 MHz injected, which was used as a reference measurement during jitter calibration.

Figure 12:
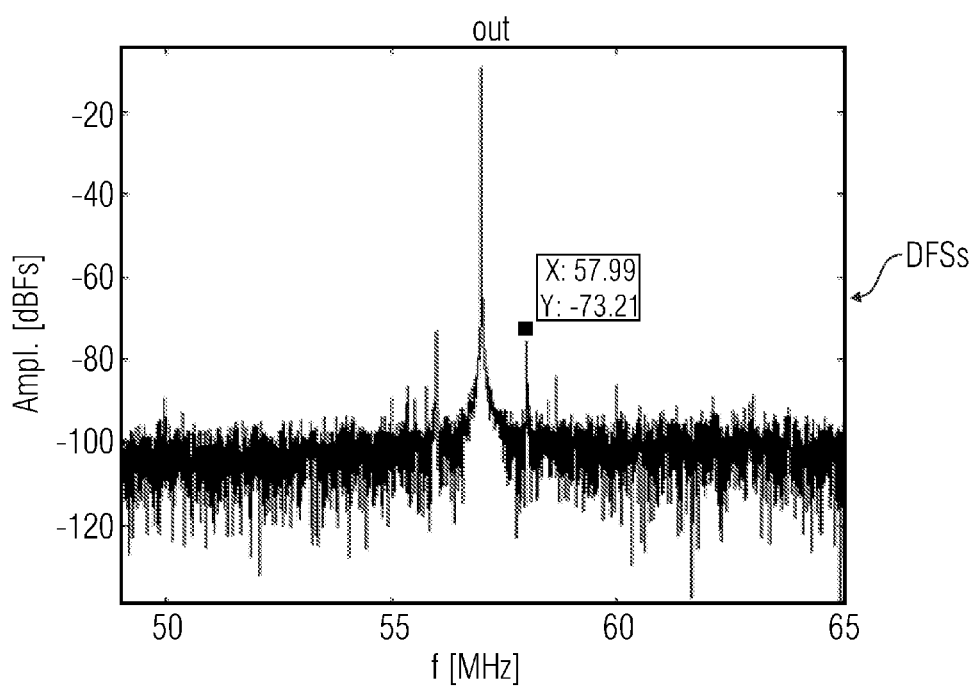
FIG. 12 shows a zoom in of the digital frequency signal shown in FIG. 11.

FIG. 12 shows a zoom in of the digital frequency signal DFSs shown in FIG. 11.

Figure 13:
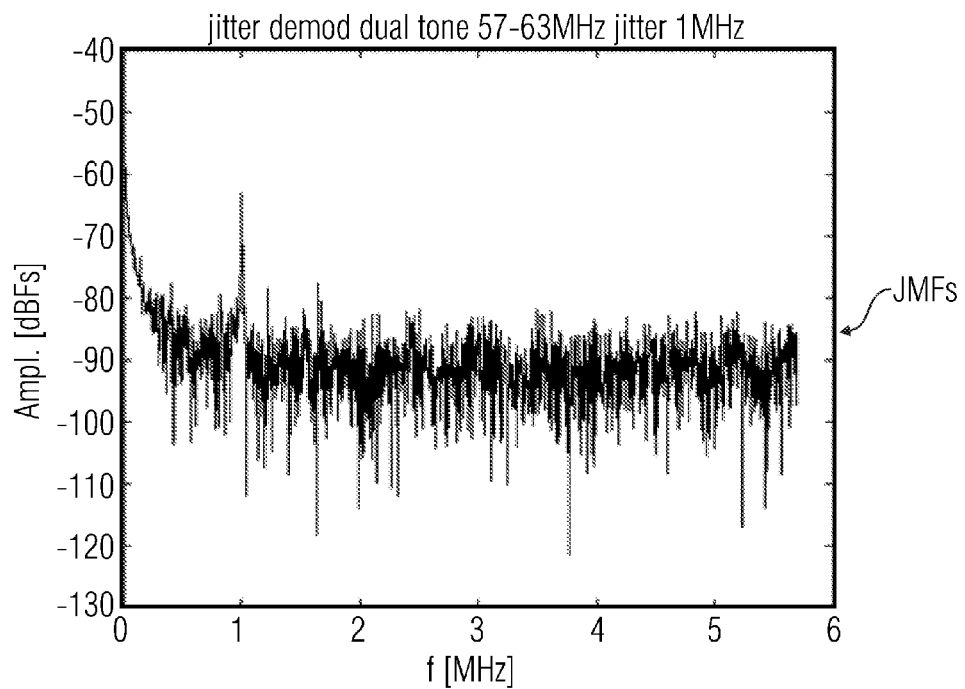
FIG. 13 shows a jitter modulation function based on a demodulation of the digital frequency signal shown in FIGS. 11 and 12, wherein the jitter has an amplitude of 3.7 ps peak-to-peak.

FIG. 13 shows the jitter modulation function JMFs based on a demodulation of the digital frequency signal DFSs shown in FIGS. 11 and 12, wherein the jitter has an amplitude of 3.7 ps peak-to-peak.

Figure 14:
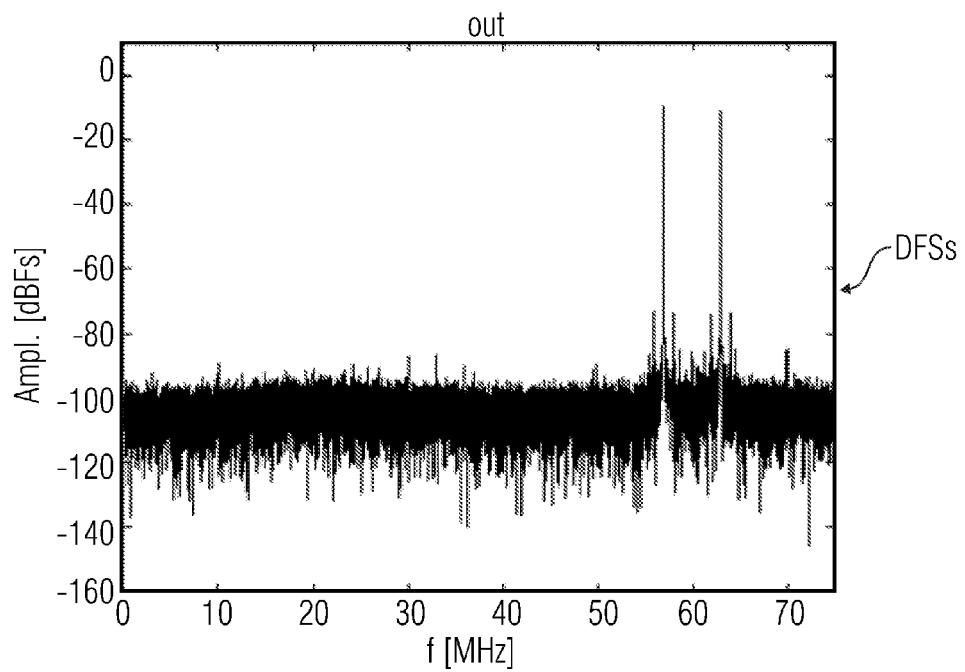
FIG. 14 shows a digital frequency signal based on the simulated analog time domain output signal having a first frequency of 57 MHz and a second frequency of 63 MHz with jitter having a frequency of 1 MHz injected.

FIG. 14 shows a digital frequency signal DFSs based on the simulated analog time domain output signal AOSs having a first frequency of 57 MHz and a second frequency of 63 MHz with jitter having a frequency of 1 MHz injected.

Figure 15:
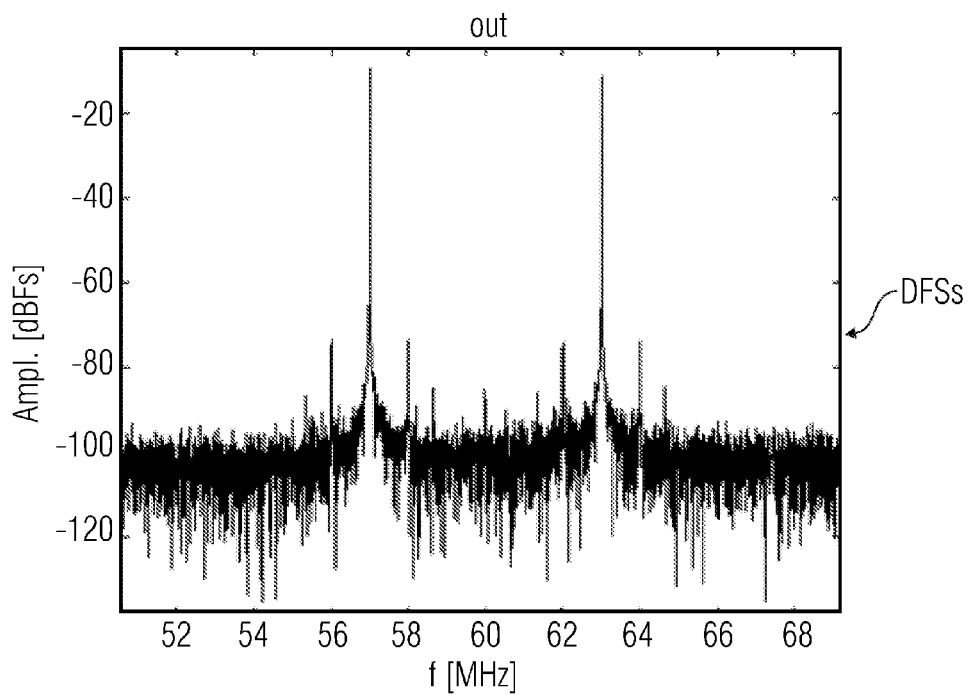
FIG. 15 shows a zoom in of the digital frequency signal shown in FIG. 14.

FIG. 15 shows a zoom in of the digital frequency signal DFSs shown in FIG. 14.

Figure 16:
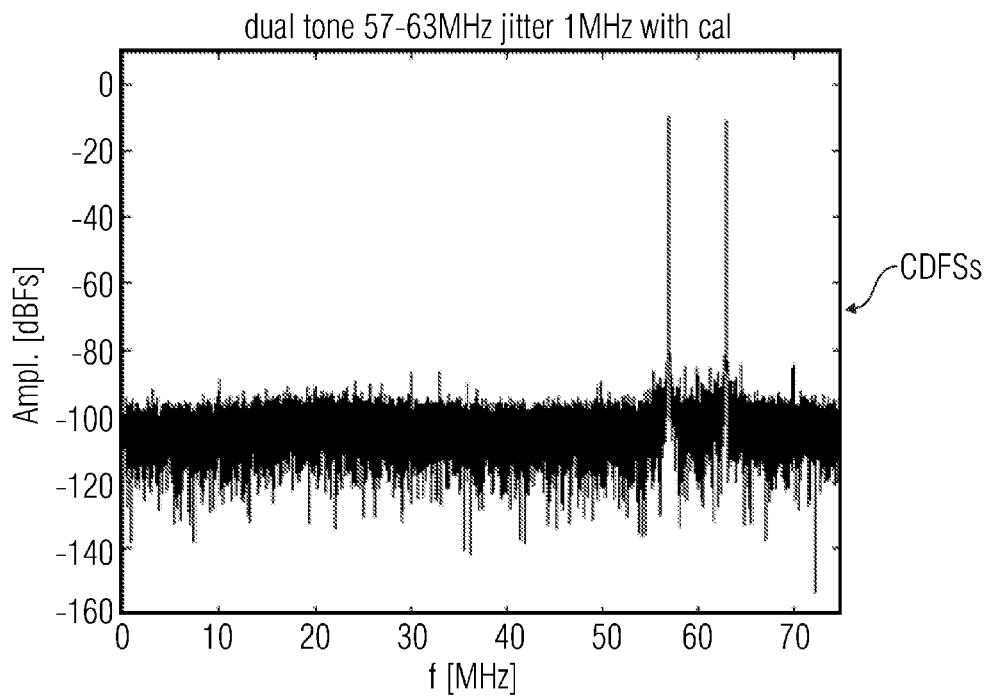
FIG. 16 shows a cleaned digital frequency signal derived from the simulated analog time domain output signal having a first frequency of 57 MHz and a second frequency of 63 MHz with jitter having a frequency of 1 MHz and a 3.7 ps peak-to-peak amplitude injected shown in FIGS. 14 and 15 using a set of operating parameters derived from the jitter modulation function of FIG. 13.

FIG. 16 shows a cleaned digital frequency signal CDFSs derived from the simulated analog time domain output signal AOSs having a first frequency of 57 MHz and a second frequency of 63 MHz with jitter having a frequency of 1 MHz and a 3.7 ps peak-to-peak amplitude injected shown in FIGS. 14 and 15 using a set of operating parameters derived from the jitter modulation function JMFs of FIG. 13.

Figure 17:
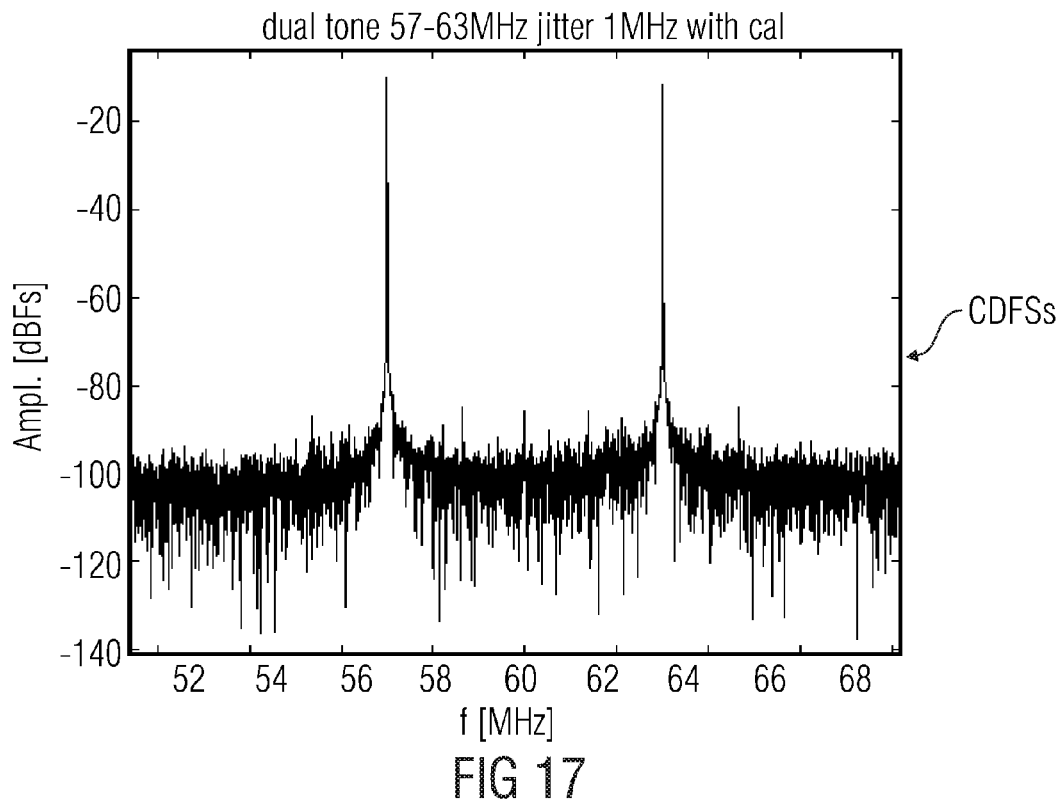
FIG. 17 shows a zoom in of the cleaned digital frequency signal shown in FIG. 16.

FIG. 17 shows a zoom in of the cleaned digital frequency signal CDFs shown in FIG. 16.

Figure 18:
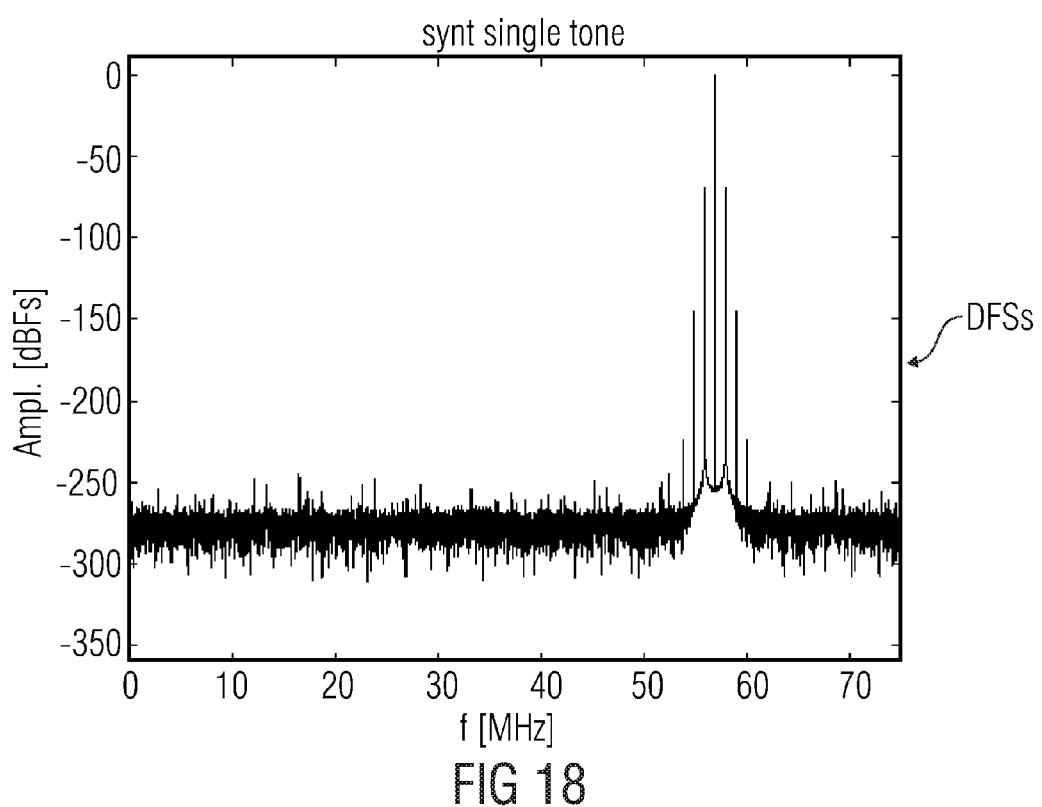
FIG. 18 shows a digital frequency signal with coherent jitter injected.

FIG. 18 shows a digital frequency signal with coherent jitter injected.

One specific aspect during the reference tone jitter calibration is the coherency of the spectral components contained in the jitter modulation function JMF. In case the jitter modulation is sinusoidal and just contains one spectral component energy leakage to side bins will occur for the modulation peaks when the jitter modulation function JMF is not coherent with respect to the coherency period selected for the application signal AOSs. As a consequence the jitter modulation function JMF no longer contains just one spectral component but several bins will be filled with jitter components. Since the jitter modulation function JMF is rarely linked in a coherent way to the sampling process it is therefore useful that the jitter modulation impact is treated for each leakage bin as it is described above for the main jitter bin. This treatment can be perceived as if the non-coherent jitter modulation function is repeated with the coherency period and needs therefore be represented with a Fourier series that reflects the leakage skirt rather than with just one sinusoidal function.

To get the full understanding of the coherency subject, the jitter calibration algorithm was executed on the above reference signal but with the signal generated mathematically. A coherent and non-coherent jitter was injected and removed respectively for comparison.

As it can be seen coherent jitter (fs=150 Msps, N=32768, M=13451, f=56.996154785 MHz, Mj=223, fj=1.020812988 MHz) maps into a single bin and the demodulated jitter also contains energy in just one bin at the jitter frequency. In such a theoretical case, the removal may be restricted to just one jitter bin.

The more realistic case of non-coherent jitter (fs=150 Msps, N=32768, M=13451, f=56.996154785 MHz, fj=1 MHz) however shows the energy leakage into neighboring bins. In such a case not just one jitter bin has to be taken into account for removal but several bins and a reasonable limit has to be established for the number of relevant bins used for jitter removal. In the demonstrated case jitter bins beyond −90 dB were taken into account for removal. With this experiment it becomes evident, that even non-coherent jitter is efficiently removed from the converted signal using the described jitter calibration method.

Figure 19:
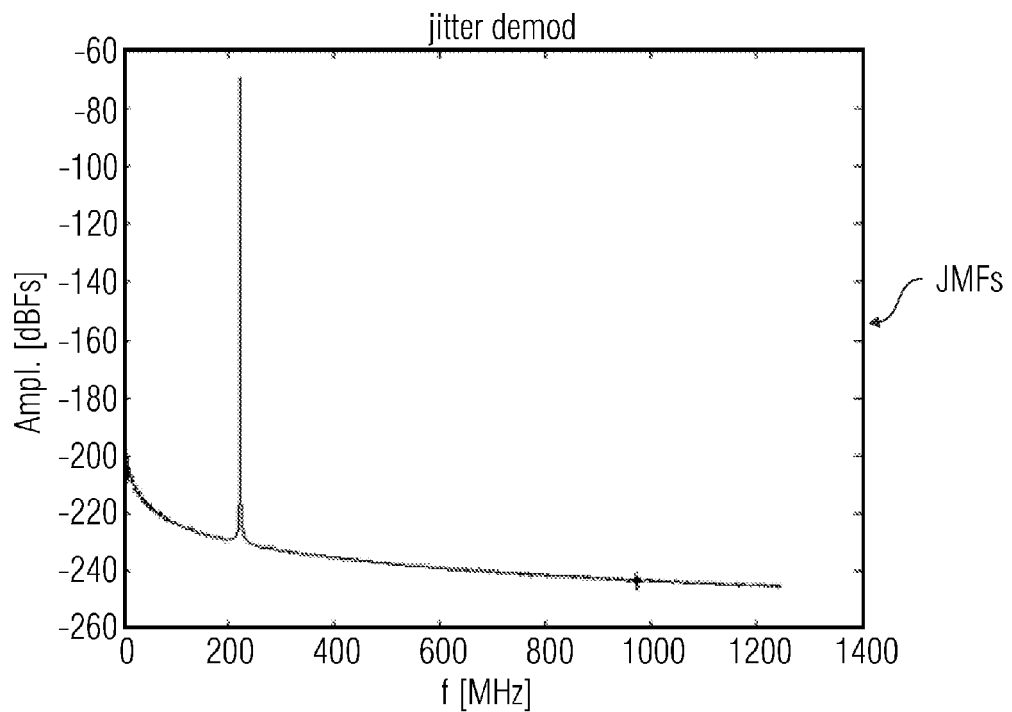
FIG. 19 shows a jitter modulation function based on a demodulation of the digital frequency signal shown in FIG. 18.

FIG. 19 shows a jitter modulation function JMFs based on a demodulation of the digital frequency signal DFSs shown in FIG. 18.

Figure 20:
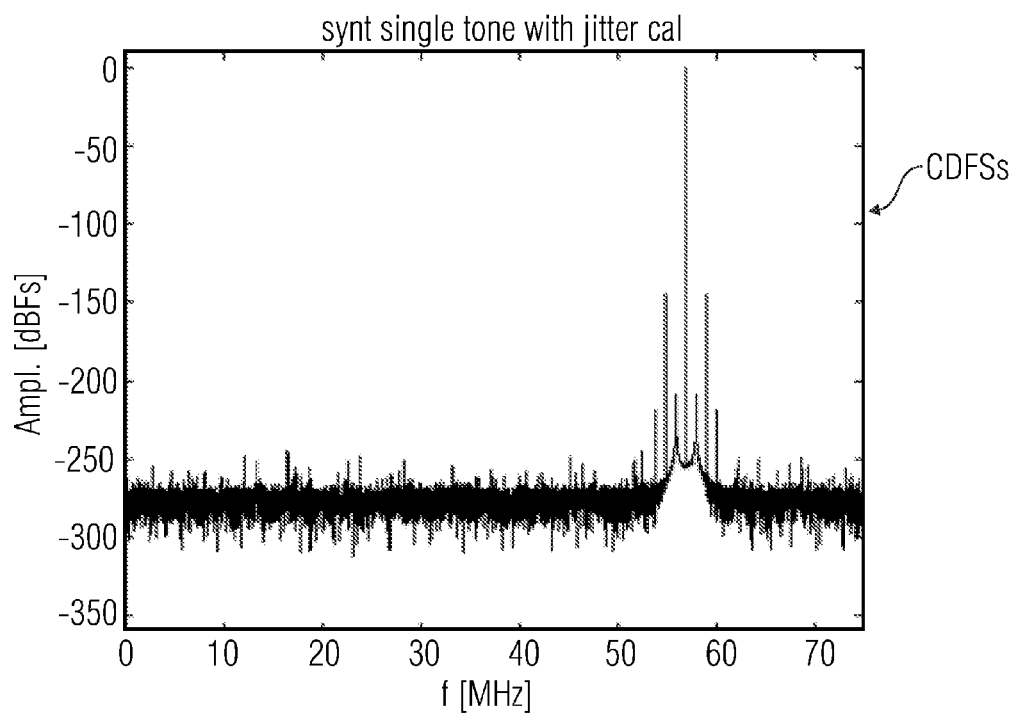
FIG. 20 shows a cleaned digital frequency signal derived from the digital frequency signal with coherent jitter injected shown in FIG. 18 using a set of operating parameters derived from the jitter modulation function of FIG. 19.

FIG. 20 shows a cleaned digital frequency signal CDFSs derived from the digital frequency signal DFSs with coherent jitter injected shown in FIG. 18 using a set SPA of operating parameters derived from the jitter modulation function JMF of FIG. 19.

Figure 21:
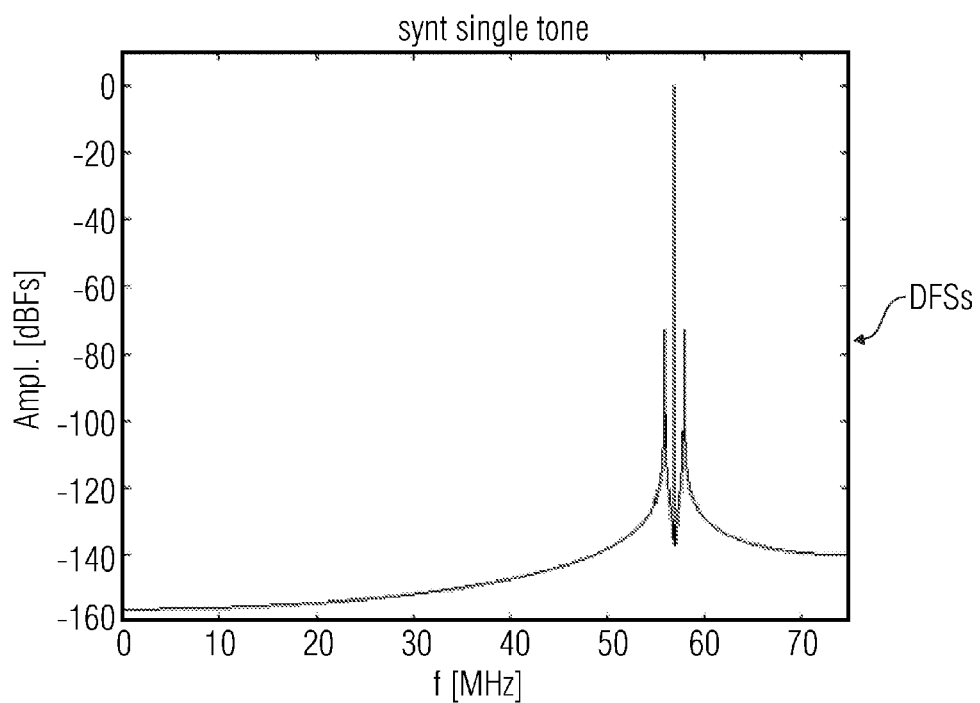
FIG. 21 shows a digital frequency signal with non-coherent jitter injected having a frequency $f_j$ of 1 MHz.

FIG. 21 shows a digital frequency signal DFSs with non-coherent jitter injected having a frequency $f_j$ of 1 MHz.

Figure 22:
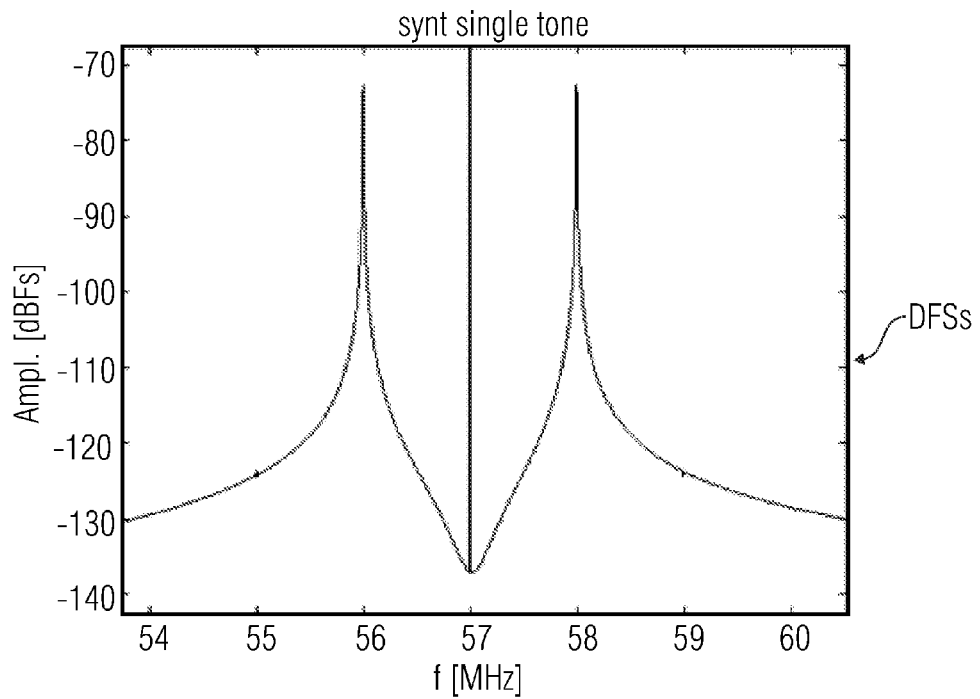
FIG. 22 shows a zoom in of the digital frequency signal shown in FIG. 21.

FIG. 22 shows a zoom in of the digital frequency signal DFSs shown in FIG. 21.

Figure 23:
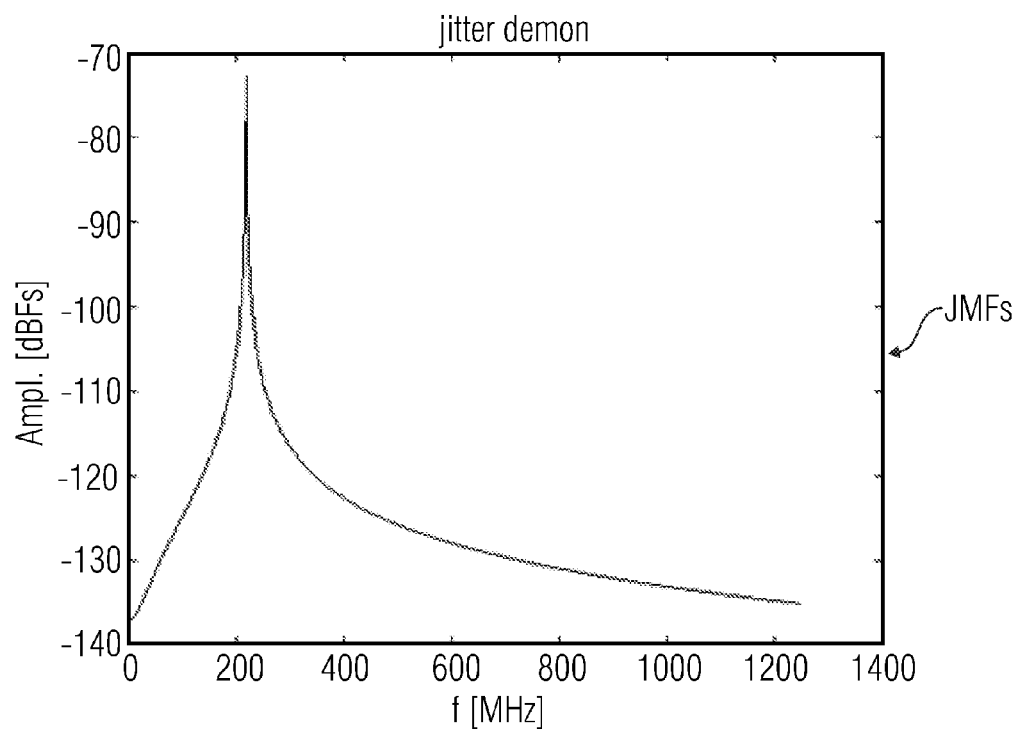
FIG. 23 shows a jitter modulation function for the case of none-coherent jitter based on a demodulation of the digital frequency signal shown in FIGS. 21 and 22.

FIG. 23 shows a jitter modulation function JMFs for the case of none-coherent jitter based on a demodulation of the digital frequency signal shown in FIGS. 21 and 22.

Figure 24:
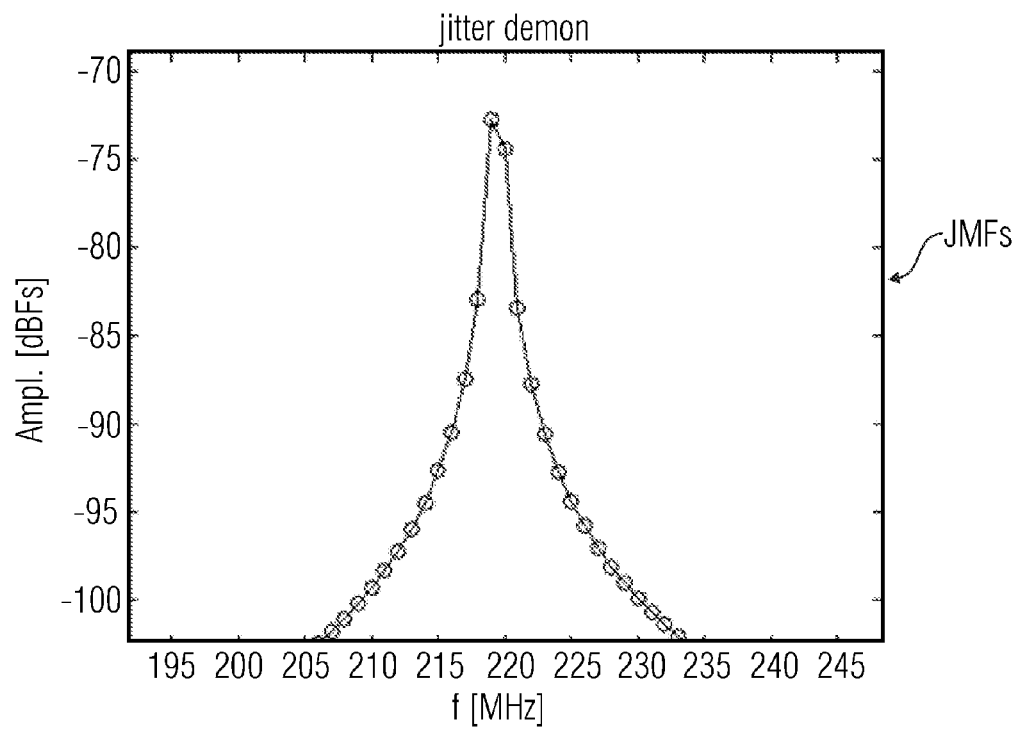
FIG. 24 shows a zoom in of the jitter modulation function shown in FIG. 23 wherein the zooming in shows the bin values as dots.

FIG. 24 shows a zoom in of the jitter modulation function JMFs shown in FIG. 23 wherein the zooming in shows the bin values as dots.

Figure 25:
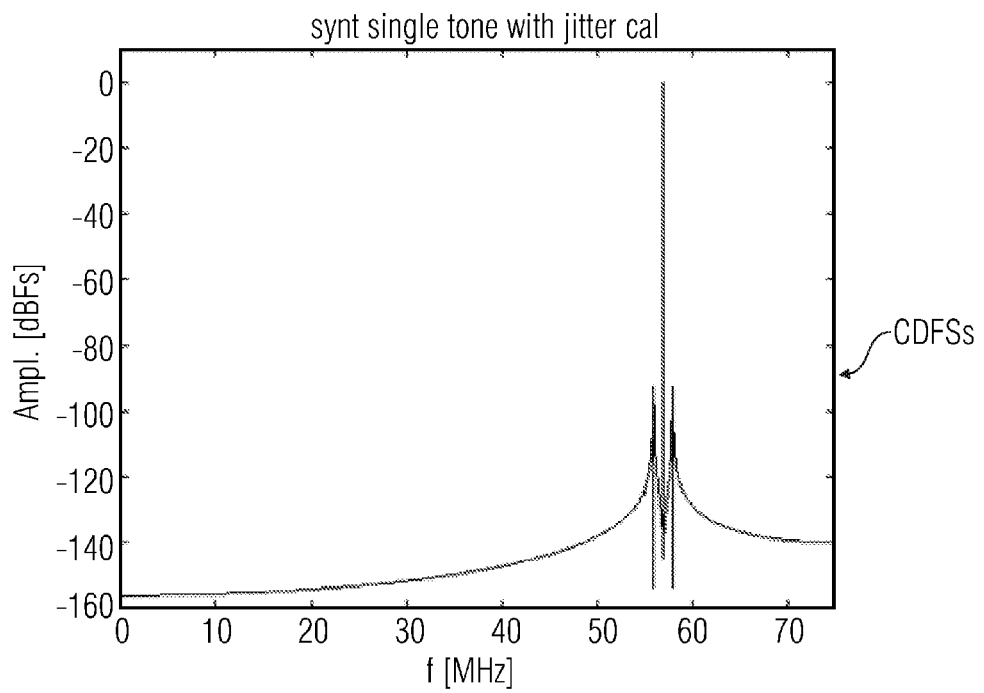
FIG. 25 shows a cleaned digital frequency signal derived from the digital frequency signal with non-coherent jitter injected shown in FIGS. 21 and 22 using a set of operating parameters derived from the jitter modulation function of FIG. 23 an 24.

FIG. 25 shows a cleaned digital frequency signal CDFSs derived from the digital frequency signal DFSs with non-coherent jitter injected shown in FIGS. 21 and 22 using a set SPA of operating parameters derived from the jitter modulation function JMFs of FIG. 23 an 24.

Figure 26:
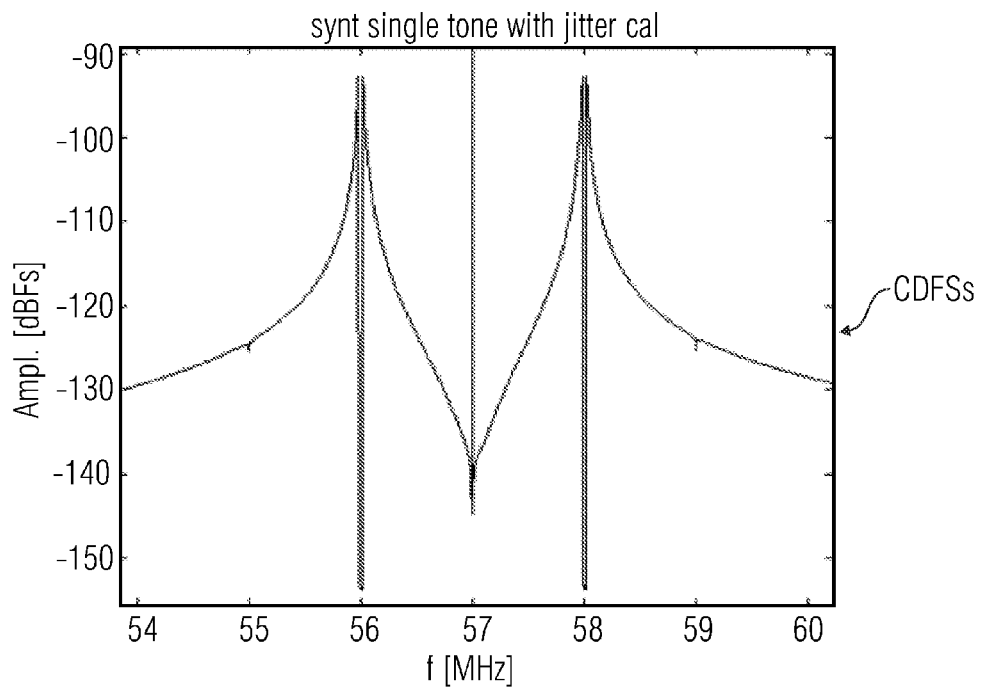
FIG. 26 shows a zoom in of the cleaned digital frequency signal shown in FIG. 25.

FIG. 26 shows a zoom in of the cleaned digital frequency signal CDFSs shown in FIG. 25.

With respect to the devices and the methods of the described embodiments the following shall be mentioned:

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, which is stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may be configured, for example, to be transferred via a data communication connection, for example via the Internet.

A further embodiment comprises a processing means, for example a computer, or a programmable logic device, configured or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An automated test equipment for analyzing an analog time domain output signal of an electronic device under test, the automated test equipment comprising:
   an analog-to-digital converter configured for converting an analog time domain signal into a digital time domain signal by acquiring a sample of the analog time domain signal at each sampling point of a plurality of sampling points;
   a sampling clock configured for producing a clock signal for the analog-to-digital converter;
   a time-to-frequency converter configured for converting the digital time domain signal into a digital frequency domain signal that is represented by frequency bins;
   a memory device configured for storing a set of empirically determined operating parameters; and
   a jitter components removal module configured for removing jitter components produced by the analog-to-digital converter by using the set of empirically determined operating parameters in order to produce a cleaned digital frequency domain signal.

2. The automated test equipment according to claim 1, wherein the analog time domain signal is during a normal mode of operation the analog time domain output signal of the electronic device under test, wherein the clock signal is fed to the analog-to-digital converter for specifying each sampling point of the plurality of sampling points over time, wherein the jitter component removal module is configured for determining, based on the set of empirically determined operating parameters, for each frequency bin of the frequency bins an amplitude and a frequency of at least one lower spur comprising a lower frequency than the respective frequency bin to which it is related to and an amplitude and a frequency of at least one upper spur comprising a higher frequency than the respective frequency bin to which it is related to, wherein the jitter removal module is configured for subtracting the lower spur and the upper spur of each frequency bin of the frequency bins from the digital frequency domain signal so that the cleaned digital frequency domain signal is produced, and wherein the amplitude of the lower spur of each of the frequency bins and the amplitude of the upper spur of each of the frequency bins are calculated using a same first parameter of the set of operating parameters; and
   the frequency of the lower spur of each of the frequency bins and the frequency of the upper spur of each of the frequency bins are calculated using a same second parameter of the set of operating parameters.

3. The automated test equipment according to claim 2, wherein the first parameter corresponds to a peak-to-peak jitter amplitude of a jitter modulation function of the analog-to-digital converter and wherein the second parameter corresponds to a jitter frequency of the jitter modulation function of the analog-to-digital converter.

4. The automated test equipment according to claim 3, wherein for each frequency bin the amplitude of the lower spur and the amplitude of the upper spur is calculated based on the formula $$s_{spuri}[dBc] = 20 * \log\left(\frac{\pi}{2} f_i T_{jpp}\right),$$

with i=1 ... I, wherein I is a number of the frequency bins, $f_i$ is the frequency of the i-th frequency bin, $T_{jpp}$ is the peak-to-peak jitter amplitude and $s_{spur\ i}$ is the amplitude of the lower spur and the amplitude of the upper spur of the i-th frequency bin relative to an amplitude of the i-th frequency bin;
   wherein for each frequency bin the frequency of the lower spur is calculated based on the formula $f_{spurl\ i}=f_i-f_j/f_i$, wherein $f_{spurl\ i}$ is the frequency of the lower spur of the i-th frequency bin and $f_j$ is the jitter frequency of the jitter modulation function; and
   wherein for each frequency bin the frequency of the upper spur is calculated based on the formula $f_{spuru\ i}=f_i+f_j/f_i$, wherein $f_{spuru\ i}$ is the frequency of the upper spur of the i-th frequency bin.

5. The automated test equipment according to claim 2, further comprising:
   a reference tone signal generator configured for generating a reference tone signal comprising at least one sinusoidal signal component at a given frequency;
   a signal processor configured for calculating a jitter modulation function of the analog-to-digital converter by applying a Hilbert transform to a jitter modulated reference tone signal, which is the digital frequency domain signal produced by the analog-to-digital converter, when, during a calibration mode of operation of the automated test equipment, the reference tone signal is fed to the analog-to-digital converter as the analog time domain signal; and
   a parameter processor configured for determining the set of operating parameters based on the jitter modulation function.

6. The automated test equipment according to claim 5, wherein the signal processor is configured for calculating the jitter modulation function by using the formula $s_j(t)=\arg(\text{Hilbert}(x(t)))-2\pi f_0 t=\cos(2\pi f_j t)$, wherein $s_j(t)$ represents the jitter modulation function, $x(t)$ represents the jitter modulated reference tone signal, $f_0$ represents the frequency of the reference tone signal and $f_j$ represents the jitter frequency of the jitter modulation function.

7. The automated test equipment according to claim 5, wherein the parameter processor is configured for determining the first parameter and the second parameter of the set of operating parameters, wherein the first parameter corresponds to a peak-to-peak jitter amplitude of the jitter modulation function of the analog-to-digital converter and wherein the second parameter corresponds to a jitter frequency of the jitter modulation function of the analog-to-digital converter.

8. The automated test equipment according to claim 7, wherein the parameter processor is configured for determining the first parameter using the formula $T_{jpp}=\rho/(\pi f_0)$, wherein $T_{jpp}$ represents the peak-to-peak jitter amplitude of the jitter modulation function, $f_0$ represents the frequency of the reference tone signal and η represents a jitter modulation index.

9. The automated test equipment according to claim 7, wherein the parameter processor is configured for determining the second parameter by a spectral decomposition of the jitter modulation function.

10. The automated test equipment according to claim 7, wherein the parameter processor is configured for storing the set of operating parameters into the memory device.

11. The automated test equipment according to claim 2, further comprising:
    a connecting device connectable to a calibration device, wherein the connecting device is configured, when being connected to the calibration device during a calibration mode of operation of the automated test equipment, for receiving a reference tone signal comprising at least one sinusoidal signal component at a given frequency from the calibration device and providing the reference tone signal to the analog-to-digital converter as the analog time domain signal;
a signal processor configured for calculating a jitter modulation function of the analog-to-digital converter by applying a Hilbert transform to a jitter modulated reference tone signal, which is the digital frequency domain signal produced by the analog-to-digital converter, when, during the calibration mode of operation, the reference tone signal is fed to the analog-to-digital converter as the analog time domain signal; and
a parameter processor configured for determining the set of operating parameters based on the jitter modulation function.

12. The automated test equipment according to claim 1, further comprising:
a reference tone signal generator configured for generating a reference tone signal comprising at least one sinusoidal signal component at a given frequency; and
a connecting device connectable to a calibration device, wherein the connecting device is configured, when being connected to the calibration device during a calibration mode of operation of the automated test equipment, for transmitting the digital frequency domain signal as a jitter modulated reference tone signal to the calibration device.

13. The automated test equipment according to claim 12, wherein the connecting device is configured, when being connected to the calibration device during the calibration mode of operation, for receiving the set of operating parameters from the calibration device and for storing the set of operating parameters into the memory device.

14. The automated test equipment according to claim 1, further comprising a connecting device connectable to a calibration device, wherein the connecting device is configured, when being connected to the calibration device during a calibration mode of operation of the automated test equipment, for
receiving a reference tone signal from the calibration device and providing the reference tone signal to the analog-to-digital converter as the analog time domain signal; and
transmitting the digital frequency domain signal as a jitter modulated reference tone signal to the calibration device.

15. The automated test equipment according to claim 14, wherein the connecting device is configured, when being connected to the calibration device during the calibration mode of operation, for receiving the set of operating parameters from the calibration device and for storing the set of operating parameters into the memory device.

16. A calibration device for empirically determining a set of operating parameters for an automated test equipment for analyzing an analog time domain output signal of an electronic device under test, the calibration device comprising:
a signal processor configured for calculating a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, a reference tone signal is fed to the analog-to-digital converter as an analog time domain signal; and
a parameter processor configured for determining the set of operating parameters based on the jitter modulation function.

17. The calibration device according to claim 16, further comprising a reference tone signal generator configured for generating the reference tone signal comprising at least one sinusoidal signal component at a given frequency, wherein the automated test equipment comprises:
the analog-to-digital converter configured for converting an analog time domain signal, which is during a normal mode of operation the analog time domain output signal of the electronic device under test, into a digital time domain signal by acquiring a sample of the analog time domain signal at each sampling point of a plurality of sampling points;
a sampling clock configured for producing a clock signal, which is fed to the analog-to-digital converter for specifying each sampling point of the plurality of sampling points over time;
a time-to-frequency converter configured for converting the digital time domain signal into a digital frequency domain signal so that the digital frequency domain signal is represented by frequency bins;
a memory device configured for storing the set of empirically determined operating parameters; and
a jitter components removal module configured for removing jitter components produced by the analog-to-digital converter in order to produce a cleaned digital frequency domain signal, wherein the jitter component removal module is configured for determining, based on the set of empirically determined operating parameters, for each frequency bin of the frequency bins an amplitude and a frequency of at least one lower spur comprising a lower frequency than the respective frequency bin to which it is related to and an amplitude and a frequency of at least one upper spur comprising a higher frequency than the respective frequency bin to which it is related to, wherein the jitter removal module is configured for subtracting the lower spur and the upper spur of each frequency bin of the frequency bins from the digital frequency domain signal so that the cleaned digital frequency domain signal is produced.

18. The calibration device according to claim 17, wherein the parameter processor is configured for storing the set of operating parameters into the memory device.

19. The calibration device according to claim 16, wherein the signal processor is configured for calculating the jitter modulation function by using the formula $s_j(t)=\arg(\text{Hilbert}(x(t)))-2\pi f_0 t=\eta \cos(2\pi f_j t)$, wherein $s_j(t)$ represents the jitter modulation function, $x(t)$ represents the jitter modulated reference tone signal, $f_0$ represents the frequency of the reference tone signal and $f_j$ represents the jitter frequency of the jitter modulation function.

20. The calibration device according to claim 16, wherein the parameter processor is configured for determining a first parameter and a second parameter of the set of operating parameters, wherein the first parameter corresponds to a peak-to-peak jitter amplitude of the jitter modulation function of the analog-to-digital converter and wherein the second parameter corresponds to a jitter frequency of the jitter modulation function of the analog-to-digital converter.

21. The calibration device according to claim 20, wherein the parameter processor is configured for determining the first parameter using the formula $T_{jpp}=\eta/(\pi f_0)$, wherein $T_{jpp}$ represents the peak-to-peak jitter amplitude of the jitter modulation function, $f_0$ represents the frequency of the reference tone signal and η represents a jitter modulation index.

22. The calibration device according to claim 20, wherein the parameter processor is configured for determining the second parameter by a spectral decomposition of the jitter modulation function.

23. The calibration device according to claim 16, further comprising a connecting device connectable to the automated test equipment, wherein the connecting device is configured, when being connected to the automated test equipment during the calibration mode of operation, for
transmitting the reference tone signal to the automated test equipment;
receiving the jitter modulated reference tone signal from the automated test equipment; and
transmitting the set of operating parameters to the automated test equipment.

24. A system comprising:
an automated test equipment for analyzing an analog time domain output signal of an electronic device under test, the automated test equipment comprising:
an analog-to-digital converter configured for converting an analog time domain signal into a digital time domain signal by acquiring a sample of the analog time domain signal at each sampling point of a plurality of sampling points;
a sampling clock configured for producing a clock signal for the analog-to-digital converter;
a time-to-frequency converter configured for converting the digital time domain signal into a digital frequency domain signal that is represented by frequency bins;
a memory device configured for storing a set of empirically determined operating parameters; and
a jitter components removal module configured for removing jitter components produced by the analog-to-digital converter by using the set of empirically determined operating parameters in order to produce a cleaned digital frequency domain signal; and
a calibration device for empirically determining a set of operating parameters for the automated test equipment, the calibration device comprising:
a signal processor configured for calculating a jitter modulation function of the analog-to-digital converter by applying a Hilbert transform to a jitter modulated reference tone signal, which is a digital frequency domain signal produced by the analog-to-digital converter, when, during a calibration mode of operation of the automated test equipment, a reference tone signal is fed to the analog-to-digital converter as an analog time domain signal; and
a parameter processor configured for determining the set of operating parameters based on the jitter modulation function.

25. A method for operating an automated test equipment for analyzing an analog time domain output signal of an electronic device under test, the method comprising:
converting an analog time domain signal into a digital time domain signal using an analog-to-digital converter acquiring a sample of the analog time domain signal at each sampling point of a plurality of sampling points;
producing a clock signal for the analog-to-digital converter using a sampling clock;
converting the digital time domain signal into a digital frequency domain signal that is represented by frequency bins using a time-to-frequency converter;
storing a set of empirically determined operating parameters in a memory device; and
removing jitter components produced by the analog-to-digital converter in order to produce a cleaned digital frequency domain signal using a jitter components removal module and the set of empirically determined operating parameters.

26. The method of claim 25, wherein the analog time domain signal is during a normal mode of operation the analog time domain output signal of the electronic device under test, wherein the clock signal is fed to the analog-to-digital converter for specifying each sampling point of the plurality of sampling points over time, wherein, based on the set of empirically determined operating parameters, for each frequency bin of the frequency bins an amplitude and a frequency of at least one lower spur comprising a lower frequency than the respective frequency bin to which it is related to and an amplitude and a frequency of at least one upper spur comprising a higher frequency than the respective frequency bin to which it is related to are determined, and wherein the lower spur and the upper spur of each frequency bin of the frequency bins are subtracted from the digital frequency domain signal so that the cleaned digital frequency domain signal is produced.

27. A method for empirically determining a set of operating parameters for an automated test equipment, the method comprising:
generating a reference tone signal comprising at least one sinusoidal signal component at a given frequency using a reference tone signal generator;
establishing a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal, using a signal processor; and
determining the set of operating parameters based on the jitter modulation function using a parameter processor.

28. A non-transitory digital storage medium having computer-readable code stored thereon to perform a method for operating an automated test equipment for analyzing an analog time domain output signal of an electronic device under test, said method comprising:
converting an analog time domain signal into a digital time domain signal using an analog-to-digital converter acquiring a sample of the analog time domain signal at each sampling point of a plurality of sampling points;
producing a clock signal for the analog-to-digital converter using a sampling clock;
converting the digital time domain signal into a digital frequency domain signal that is represented by frequency bins using a time-to-frequency converter;
storing a set of empirically determined operating parameters in a memory device; and
removing jitter components produced by the analog-to-digital converter in order to produce a cleaned digital frequency domain signal using a jitter components removal module and the set of empirically determined operating parameters.

29. The non-transitory digital storage medium of claim 28, wherein the analog time domain signal is during a normal mode of operation the analog time domain output signal of the electronic device under test, wherein the clock signal is fed to the analog-to-digital converter for specifying each sampling point of the plurality of sampling points over time, wherein, based on the set of empirically determined operating parameters, for each frequency bin of the frequency bins an amplitude and a frequency of at least one lower spur comprising a lower frequency than the respective frequency bin to which it is related to and an amplitude and a frequency of at least one upper spur comprising a higher frequency than the respective frequency bin to which it is related to are determined, and wherein the lower spur and the upper spur of each frequency bin of the frequency bins are subtracted from the digital frequency domain signal so that the cleaned digital frequency domain signal is produced.

30. A non-transitory digital storage medium having computer-readable code stored thereon to perform a method for empirically determining a set of operating parameters for an automated test equipment, said method comprising:
  generating a reference tone signal comprising at least one sinusoidal signal component at a given frequency using a reference tone signal generator;
  establishing a jitter modulation function of an analog-to-digital converter of the automated test equipment by applying a Hilbert transform to a jitter modulated reference tone signal, which is a digital frequency domain signal produced by the analog-to-digital converter, when, during a calibration mode of operation of the automated test equipment, the reference tone signal is fed to the analog-to-digital converter as an analog time domain signal, using a signal processor; and
  determining the set of operating parameters based on the jitter modulation function using a parameter processor.

* * * * *